US009851414B2

(12) United States Patent
Morrison et al.

(10) Patent No.: US 9,851,414 B2
(45) Date of Patent: Dec. 26, 2017

(54) ENERGY STORAGE CELL IMPEDANCE MEASURING APPARATUS, METHODS AND RELATED SYSTEMS

(71) Applicant: BATTELLE ENERGY ALLIANCE, LLC, Idaho Falls, ID (US)

(72) Inventors: John L Morrison, Butte, MT (US); William H Morrison, Butte, MT (US); Jon P Christophersen, Moscow, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 79 days.

(21) Appl. No.: 14/789,959

(22) Filed: Jul. 1, 2015

(65) Prior Publication Data

US 2017/0003354 A1 Jan. 5, 2017

(51) Int. Cl.
| | |
|---|---|
| *G01N 27/416* | (2006.01) |
| *G01R 19/00* | (2006.01) |
| *G01R 23/00* | (2006.01) |
| *G01R 31/36* | (2006.01) |

(52) U.S. Cl.
CPC ..... *G01R 31/3662* (2013.01); *G01R 31/3606* (2013.01)

(58) Field of Classification Search
CPC .................. G01R 31/3662; G01R 31/3606
USPC ..................................... 324/430; 702/64, 75
See application file for complete search history.

(56) References Cited

U.S. PATENT DOCUMENTS

| | | | |
|---|---|---|---|
| 4,498,044 | A | 2/1985 | Horn |
| 4,697,134 | A | 9/1987 | Burkum et al. |
| 5,061,890 | A | 10/1991 | Longini et al. |
| 5,261,007 | A | 11/1993 | Hirsch |

(Continued)

FOREIGN PATENT DOCUMENTS

| | | |
|---|---|---|
| EP | 2447728 B1 | 6/2013 |
| JP | 2000009817 A | 1/2000 |

(Continued)

OTHER PUBLICATIONS

Albrecht, Weston, "Battery Complex Impedance Identification with Random Signal Techniques," May 4, 2005, Montana Tech of the University of Montana, 99 pages.

(Continued)

*Primary Examiner* — M'Baye Diao
(74) *Attorney, Agent, or Firm* — TraskBritt

(57) ABSTRACT

Energy storage cell impedance testing devices, circuits, and related methods are disclosed. An energy storage cell impedance measuring device includes a sum of sinusoids (SOS) current excitation circuit including differential current sources configured to isolate a ground terminal of the differential current sources from a positive terminal and a negative terminal of an energy storage cell. A method includes applying an SOS signal comprising a sum of sinusoidal current signals to the energy storage cell with the SOS current excitation circuit, each of the sinusoidal current signals oscillating at a different one of a plurality of different frequencies. The method also includes measuring an electrical signal at a positive terminal and a negative terminal of the energy storage cell, and computing an impedance of the energy storage cell at each of the plurality of different frequencies using the measured electrical signal.

26 Claims, 10 Drawing Sheets

(56) References Cited

U.S. PATENT DOCUMENTS

| | | |
|---|---|---|
| 5,406,496 A | 4/1995 | Quinn |
| 5,454,377 A | 10/1995 | Dzwonczyk et al. |
| 5,512,832 A | 4/1996 | Russell |
| 5,946,482 A | 8/1999 | Barford et al. |
| 5,969,625 A | 10/1999 | Russo et al. |
| 6,002,238 A | 12/1999 | Champlin |
| 6,072,299 A | 6/2000 | Kurle et al. |
| 6,160,382 A | 12/2000 | Yoon et al. |
| 6,208,147 B1 | 3/2001 | Yoon et al. |
| 6,222,369 B1 | 4/2001 | Champlin |
| 6,249,186 B1 | 6/2001 | Ebihara et al. |
| 6,262,563 B1 | 7/2001 | Champlin |
| 6,307,378 B1 | 10/2001 | Kozlowski |
| 6,330,933 B1 | 12/2001 | Boeckman et al. |
| 6,472,847 B2 | 10/2002 | Lundberg |
| 6,481,289 B2 | 11/2002 | Dixon et al. |
| 6,519,539 B1 | 2/2003 | Freeman et al. |
| 6,653,817 B2 | 11/2003 | Tate, Jr. et al. |
| 6,691,095 B2 | 2/2004 | Singh et al. |
| 6,778,913 B2 | 8/2004 | Tinnemeyer |
| 6,816,797 B2 | 11/2004 | Freeman et al. |
| 6,832,171 B2 | 12/2004 | Barsoukov et al. |
| 6,876,174 B1 | 4/2005 | Samittier Marti et al. |
| 7,051,008 B2 | 5/2006 | Singh et al. |
| 7,065,474 B2 | 6/2006 | Petchenev et al. |
| 7,072,871 B1 | 7/2006 | Tinnemeyer |
| 7,395,163 B1 | 7/2008 | Morrison et al. |
| 7,616,003 B2 | 11/2009 | Satoh et al. |
| 7,675,293 B2 | 3/2010 | Christophersen et al. |
| 7,698,078 B2 | 4/2010 | Kelty et al. |
| 7,898,263 B2 | 3/2011 | Ishida et al. |
| 8,150,643 B1 | 4/2012 | Morrison et al. |
| 8,193,771 B2 | 6/2012 | Coccio |
| 8,332,342 B1 | 12/2012 | Saha et al. |
| 8,352,204 B2 | 1/2013 | Morrison et al. |
| 8,368,357 B2 | 2/2013 | Ghantous et al. |
| 8,415,926 B2 | 4/2013 | Bhardwaj et al. |
| 8,447,544 B2 | 5/2013 | Hsu et al. |
| 8,467,984 B2 | 6/2013 | Gering |
| 8,487,628 B2 | 7/2013 | Sciarretta et al. |
| 8,521,497 B2 | 8/2013 | Gering |
| 8,532,945 B2 | 9/2013 | Sciarretta et al. |
| 8,548,762 B2 | 10/2013 | Prada et al. |
| 8,582,675 B1 * | 11/2013 | Harris .................... H04K 3/45 324/76.12 |
| 8,598,849 B2 | 12/2013 | Bhardwaj et al. |
| 8,648,602 B2 | 2/2014 | van Lammeren |
| 8,680,868 B2 | 3/2014 | van Lammeren et al. |
| 8,725,456 B1 | 5/2014 | Saha et al. |
| 8,738,310 B2 | 5/2014 | Swanton |
| 8,738,311 B2 | 5/2014 | Wu |
| 8,762,109 B2 | 6/2014 | Christophersen et al. |
| 8,773,145 B2 | 7/2014 | Phlippoteau et al. |
| 8,831,897 B2 | 9/2014 | McHardy |
| 8,838,401 B2 | 9/2014 | Kelly |
| 8,849,598 B2 | 9/2014 | Mingant et al. |
| 8,868,363 B2 | 10/2014 | Morrison et al. |
| 8,889,309 B2 | 11/2014 | Manabe et al. |
| 8,907,675 B2 | 12/2014 | Phlippoteau et al. |
| 8,952,823 B2 | 2/2015 | Xie et al. |
| 9,030,173 B2 | 5/2015 | McHardy et al. |
| 9,207,285 B1 | 12/2015 | Swanton et al. |
| 9,252,465 B2 | 2/2016 | Hariharan |
| 9,465,077 B2 | 10/2016 | Love et al. |
| 2002/0065621 A1 | 5/2002 | Jungerman |
| 2003/0184307 A1 | 10/2003 | Kozlowski et al. |
| 2003/0206021 A1 | 11/2003 | Laletin et al. |
| 2004/0095249 A1 | 5/2004 | Zaccaria |
| 2004/0162683 A1 | 8/2004 | Verbrugge et al. |
| 2005/0127908 A1 | 6/2005 | Schlicker et al. |
| 2005/0182584 A1 | 8/2005 | Plusquellic |
| 2006/0111854 A1 | 5/2006 | Plett |
| 2006/0111870 A1 | 5/2006 | Plett |
| 2006/0170397 A1 | 8/2006 | Srinivasan et al. |
| 2006/0284617 A1 | 12/2006 | Kozlowski et al. |
| 2006/0284618 A1 | 12/2006 | Cho et al. |
| 2007/0172708 A1 | 7/2007 | Takebe et al. |
| 2007/0257681 A1 | 11/2007 | Christophersen et al. |
| 2008/0303528 A1 | 12/2008 | Kim |
| 2009/0076752 A1 | 3/2009 | Wang et al. |
| 2009/0278037 A1 * | 11/2009 | Grothe, Jr. .......... H01J 49/0036 250/282 |
| 2010/0010762 A1 | 1/2010 | Seki |
| 2010/0201320 A1 | 8/2010 | Coe et al. |
| 2010/0274510 A1 * | 10/2010 | Morrison ........... G01R 31/2837 702/75 |
| 2010/0332165 A1 | 12/2010 | Morrison et al. |
| 2011/0077880 A1 | 3/2011 | Gering |
| 2011/0270559 A1 | 11/2011 | Christophersen et al. |
| 2011/0301931 A1 | 12/2011 | Gering |
| 2012/0019253 A1 | 1/2012 | Ziegler et al. |
| 2012/0032688 A1 | 2/2012 | Christophersen et al. |
| 2012/0038452 A1 | 2/2012 | Phlippoteau et al. |
| 2012/0078552 A1 | 3/2012 | Mingant et al. |
| 2012/0105070 A1 | 5/2012 | van Lammeren et al. |
| 2012/0188086 A1 | 7/2012 | Xie et al. |
| 2012/0262186 A1 | 10/2012 | Morrison et al. |
| 2012/0316815 A1 | 12/2012 | Morigaki |
| 2013/0002267 A1 | 1/2013 | Kothandaraman et al. |
| 2013/0069660 A1 | 3/2013 | Bernard et al. |
| 2013/0141109 A1 | 6/2013 | Love et al. |
| 2013/0229156 A1 | 9/2013 | Brandon et al. |
| 2014/0125284 A1 | 5/2014 | Qahouq |
| 2014/0358462 A1 * | 12/2014 | Christophersen .. G01R 31/3662 702/65 |
| 2014/0372054 A1 | 12/2014 | Wang et al. |
| 2014/0372055 A1 | 12/2014 | Wang et al. |
| 2015/0002105 A1 | 1/2015 | Kelly |
| 2015/0165921 A1 | 6/2015 | Paryani |
| 2015/0168500 A1 | 6/2015 | Jamison |
| 2015/0197159 A1 | 7/2015 | Lee |

FOREIGN PATENT DOCUMENTS

| | | |
|---|---|---|
| WO | 2004106946 A2 | 12/2004 |
| WO | 2010144834 A2 | 12/2010 |
| WO | 2010144857 A2 | 12/2010 |
| WO | 2011041094 A1 | 4/2011 |
| WO | 2011140123 A1 | 11/2011 |
| WO | 2011140131 A1 | 11/2011 |
| WO | 2013085996 A1 | 6/2013 |
| WO | 2014070831 A1 | 5/2014 |
| WO | 2015029647 A1 | 3/2015 |
| WO | 2016012922 A1 | 1/2016 |

OTHER PUBLICATIONS

Alpaydin, Ethem, "Radial Basis Functions," 2004, Chapter 12.3, pp. 284-290, Introduction to Machine Learning, The MIT Press, Cambridge, Massachusetts, London, England.

Bald et al., "Hardware Architecture for Rapid Impedance Measurements of 50V Battery Module", San Diego : The International Society of Automation, 2012. 58th International Instrumentation Symposium, INL/CON-12-24516, Jun. 2012, 18 pages.

"Battery Test Manual for Plug-In Hybrid Electric Vehicles", INL/EXT-07-12536, Revision 0, Mar. 2008, 67 pages.

"Battery Test Manual for Plug-In Hybrid Electric Vehicles", INL/EXT-07-12536, Revision 2, Dec. 2010, 67 pages.

Brigham, "The Fast Fourier Transform", 1974, Prentice-Hall, Chapter 1 pp. 1-10.

Brigham, "The Fast Fourier Transform", 1974, Prentice Hall, Chapter 7 pp. 110-122.

Brigham, "The Fast Fourier Transform", 1974, Prentice-Hall, Chapter 13 pp. 198-223.

Chapra, "Numerical Methods for Engineers," pp. 394-398, McGraw-Hill Publishing Company, 1985.

Christophersen, Jon P., "Battery State-Of-Health Assessment Using a Near Real-Time Impedance Measurement Technique Under No-Load and Load Conditions", A dissertation submitted in partial fulfillment of the requirements for the degree of Doctor of Philosophy in Electrical Engineering, Montana State University, Apr. 2011, 288 pages.

(56) References Cited

OTHER PUBLICATIONS

Christophersen et al., "Crosstalk Compensation for a Rapid, Higher-Resolution Impedance Spectrum Measurement", Aerospace Conference, 2012 IEEE, Mar. 2012, 16pages.
Christophersen et al., "Effects of Reference Performance Testing during Aging Using Commercial Lithium-ion Cells," J. Electrochem Soc., 153(7) 2006, pp. A2406-A1416.
Christophersen et al., "Electrochemical Impedance Spectroscopy Testing on the Advanced Technology Development Program Lithium-ion Cells", 2002, IEEE Trans. Veh. Technol., pp. 1851-1855, 56(3).
Christophersen et al., "Gen 2 Performance Evaluation Final Report", INL/EXT-05-00913, Advanced Technology Development Program for Lithium-Ion Batteries, Jul. 2006, 140 pages.
Christophersen, Jon P., "Impedance Noise Identification for State-of-Health Prognostics," Jul. 7-10, 2008, Philadelphia, PA, 43rd Power Sources Conference, 4 pages.
Christophersen et al., "Long-Term Validation of Rapid Impedance Spectrum Measurements as a Battery State-of-Health Assessment Technique", INL/CON-12-27063 SAE 2013 World, Apr. 2013, 11 pages.
Christophersen et al., "Lumped Parameter Modeling as a Predictive Tool for a Battery Status Monitor," Oct. 2003, Proceedings from IEEE Vehicular Technology Conference, 6 pages.
Christophersen et al., "Rapid Impedance Spectrum Measurements for State-of-Health Assessment of Energy Storage Devices", INL/CON-11-22677 SAE 2012 World Congress & Exhibition, Apr. 2012, 12 pages.
Egloff et al., "A Critical Analysis of an Instrumentation Current Sources", Cleveland : The International Society of Automation, 2013. 59th International Instrumentation Symposium, May 2013.
Fenton et al., "BSM Development Documentation Senior Project Final Report for the Idaho National Laboratory," May 2005, Montana Tech of the University of Montana, 21 pages.
"FreedomCAR Battery Test Manual for Power-Assist Hybrid Electric Vehicles," manual, Oct. 2003, Appendix D, DOE/ID-11069, Idaho National Laboratory, 130 pages.
Garcia et al., "On-line State-of-Health and Remaining-Useful-Life Assessment of Batteries using Rapid Impedance Spectrum Measurements", 45th Power Sources Conference Proceedings, 7.3, 2012, pp. 115-118.
Goebel et al., "Prognostics in Battery Health Management", IEEE Instrumentation & Measurement Magazine, 1094-6969/08, Aug. 2008, pp. 33-40.
Hoffmann et al. "Development and Test of a Real Time Battery Impedance Estimation System", IEEE Aerospace 2006 Conference, Mar. 5-11, 2006, Big Sky Montana.
Huet, F., "A review of impedance measurements for determination of the state-of-charge or state-of-health of secondary batteries", Journal of Power Sources 70, 1998, pp. 59-69.
"Impedance Measurement Box", INL R&D 100 Technologies—2011. [Online] Idaho National Laboratory. [Cited: Mar. 21, 2012.] http://www.inl.gov/rd100/2011/impedance-measurement-box/, 3 pages.
Kozlowski, James D., "Electrochemical Cell Prognostics using Online Impedance Measurements and Model-Based Data Fusion Techniques", Aerospace Conference, 2003 Proceedings, vol. 7-3257, Mar. 2003, 14 pages.
Mix, Dwight F., "Random Signal Processing," p. 296, Prentice Hall Publishing Company, 1995.
Morrison et al., "An Advanced Calibration Procedure for Complex Impedance Spectrum Measurements of Advanced Energy Storage", San Diego : The International Society of Automation, 2012. 58th International Instrumentation Symposium, INL/CON-12-24519, Jun. 2012, 17 pages.
Morrison, J. L., "DC Buffering and Floating Current for a High Voltage IMB Application", INL/EXT-14-32858, Prepared for the U.S. Department of Energy, https://inldigitallibrary.inl.gov/sti/6330933.pdf, Aug. 2014, 8 pages.
Morrison et al., "Fast Summation Transformation for Battery Impedance Identification," IEEE Aerospace 2009 conference, Mar. 7-14, 2009, Big Sky, Montana, 9 pages.
Morrison, William H., "Intelligent Self-Evolving Prognostic Fusion, Phase I STTR Interim Report," Jul. 29, 2005, Qualtech Systems, Inc., NASA, Ames Research Center, 23 pages.
Morrison et al., "Real Time Estimation of Battery Impedance," Proceedings from the IEEE Aerospace Conference, Mar. 5-11, 2006, Big Sky, MT, 13 pages.
Morrison, J.L., "Signals and Systems: State Variable Description of Linear Time Invariant Systems", Montana Tech Digital Commons, Sep. 2013, chapter 17, pp. 198-214.
Morrison, J.L., "Signals and Systems: Recursive Solution of Linear Time Invariant Systems", Montana Tech Digital Commons, Sep. 2013, Chapter 18, pp. 215-226.
Morrison, J.L., "Signals and Systems: Synchronous Detection", Montana Tech Digital Commons, Sep. 2013, Chapter 20, pp. 241-244.
Nikolopoulos et al., "Accurate Method of Representation of High-Voltage Measuring Systems and its Application in High-Impulse-Voltage Measurements," Mar. 1989, IEEE, vol. 136, Issue 2, pp. 66-72, Science, Measurement and Technology, IEEE Proceedings A, Dept. of Electr. Eng., Nat. Tech. Univ., Athens, Greece.
PCT International Search Report and Written Opinion of the International Searching Authority for PCT/US2010/038358, dated Dec. 31, 2010, 8 pages.
PCT International Search Report and Written Opinion of the International Searching Authority for PCT/US2010/038401, dated Dec. 31, 2010, 8 pages.
PCT International Search Report and Written Opinion of the International Searching Authority for PCT/US2011/035043, dated Aug. 10, 2011, 12 pages.
PCT International Search Report and Written Opinion of the International Searching Authority for PCT/US11/35052, dated Jul. 26, 2011, 11 pages.
Piller et al., "Methods for state-of-charge determination and their applications", Journal of Power Sources 96, 2001, pp. 113-120.
Ramos et al., Comparison of impedance measurements in a DSP using ellipse-fit and seven-parameter sine-fit algorithms, Measurement 42 (May 23, 2009) pp. 1370-1379. Retrieved online at <http://www.sciencedirect.com/science/article/pii/S0263224109001031>.
Ranade et al., An overview of harmonics modeling and simulation, Elect. Power Syst. Res., vol. 74, pp. 37-56, Apr. 2005, Retrieved online at <http://www.calvin.edu/~pribeiro/IEEE/ieee_cd/chapters/pdffiles/c1pdf.pdf>.
Saha et al., "Prognostics Methods for Battery Health Monitoring Using a Bayesian Framework", IEEE Transactions on Instrumentation and Measurement, vol. 58, No. 2, Feb. 2009, pp. 291-296.
Smith et al., "Model Validation Approaches for Nonlinear Feedback Systems Using Frequency Response Measurements," Dec. 7-10, 1999, 1500-1504, vol. 2, IEEE, Proceedings of the 38th IEEE Conference on Decision and Control, Phoenix, AZ.
Smyth, Brian, "Development of a Real Time Battery Impedance Measuring System," M.S. Thesis Montana Tech of the University of Montana, 2008, 128 pages.
U.S. Appl. No. 61/831,001 to Christophersen et al., titled "Apparatuses and Methods for Testing Electrochemical Cells by Measuring Frequency Response", filed Jun. 4, 2013.
Wasserman, Philip D., "Radial Basis-Function Networks," Chapter 8, pp. 147-176, Advanced Methods in Neural Computing, 1993, New York: Van Nostrand Reinhold.
Ziemer et al., "Signals and Linear Systems," 2002, Chapter 2, pp. 56-123, Principles of Communications, 5th edition, John Wiley & Sons.
Belt et al., "Calendar and PHEV cycle life aging of high-energy, lithium-ion cells containing blended spinel and layered-oxide cathodes", Journal of Power Sources 196, 2011, pp. 10213-10221.
PCT International Search Report of the International Searching Authority for PCT/US2016/039533, mailed Sep. 14, 2016, 2 pages.
PCT International Written Opinion of the International Searching Authority for PCT/US2016/039533, mailed Sep. 14, 2016, 7 pages.

(56) References Cited

OTHER PUBLICATIONS

Verbrugge, Mark, "Adaptive, multi-parameter battery state estimator with optimized time-weighting factors" J Appl Electrochem, vol. 37 (2007) pp. 605-616.
Verbrugge et al., "Adaptive state of charge algorithm for nickel metal hydride batteries including hysteresis phenomena" Journal of Power Sources, 126 (2004) pp. 236-249.
Waligo et al., "A Comparison of the Different Broadband Impedance Measurement Techniques for Lithium-Ion Batteries", Energy Conversion congress and Exposition (ECCE), IEEE (2016) 7 pages.
Yamada et al., "The intelligent automotive battery, 'CYBOX' ", Journal of Power Sources 185 (2008) pp. 1478-1483.
Yoo et al., "An Electrochemical Impedance Measurement Technique Employing Fourier Transform", Analytical chemistry, vol. 72, No. 9 (May 2000) pp. 2035-2041.
Zechang et al., "Battery Management Systems in the China-made 'Start' series FCHVs", IEEE Vehicle Power and Propulsion Conference (VPPC) (Sep. 2008) 6 pages.
Zhang et al., "Cycling degradation of an automotive LiFePO4 lithium-ion battery", Journal of Power Sources, 196 (2011) pp. 1513-1520.
Zhu et al., "In-Situ Assessment of PEM Fuel Cells via AC Impedance at Operational Loads", http://folk.ntnu.noiskoge/prost/proceedings/aiche-2004/pdifiles/papers/014g.pdf (2004) 5 pages.
Zhu et al., "In-Situ Electrical Characterization of PEM Fuel Cells at Load", American Institute of Chemical Engineers (2007) 5 pages.
Zhu et al., "PSpice Simulation via AC Impedance for PEFC at Operational Loads", http://folk.ntnu.no/skoge/prost/proceedings/aiche-2005/topical/pdffiles/T1/papers/215c.pdf (2005) 3 pages.
Aglzim et al., "Characterization of the Resistance of a Fuel Cell on Load by Electrochemical Impedance pectroscopy", Proceedings from the EUROCON Conference, IEEE (2007) pp. 1489-1492.
Ashtiani, Cyrus N., "Battery Hazard Modes and Risk Mitigation Analysis", USABC Version 0.0 (Aug. 2007) 10 pages.
Baert et al., "Determination of the State-of-Health of VRLA Batteries by Means of Noise Measurements", IEEE (downloaded Feb. 2010) pp. 301-306.
Banaei et al., "Online Detection of terminal voltage in Li-ion Batteries via Battery Impulse Response", IEEE (2009) pp. 194-198.
"Battery Calendar Life Estimatory Manual, Modeling and Simulation", U.S. Department of Energy Vehicle Technologies Program, Revision 1, INL-EXT-08-15136, (Oct. 2012), 84 pages.
"Battery Test Manual for Plug-In Hybrid Electric Vehicles", U.S. Department of Energy Vehicle Technologies Program, INL/EXT-14-32849, Revision 3 (Sep. 2014) 82 pages.
"Battery Test Manual for 38 Volt Mild Hybrid Electric Vehicles", U.S. Department of Energy Vehicle Technologies Program, INL/EXT-15-36567, Revision 0 (Mar. 2017) 70 pages.
"Battery Test Manual for 12 Volt Start/Stop Vehicles", U.S. Department of Energy Vehicle Technologies Program, INL/EXT-12-26503, Revision 1 (May 2015) 67 pages.
"Battery Test Manual for Electric Vehicles", U.S. Department of Energy Vehicle Technologies Program, INL/EXT-15-34184, Revision 3 (Jun. 2015) 67 pages.
Blanke et al., "Impedance measurements on lead-acid batteries for state-of-charge, state-of-health and cranking aapability prognosis in electric and hybrid electric venicles", Journal of Power Sources, 144 (2005) pp. 418-425.
Blidberg, Andreas, "Correlation between different impedance measurement methods for battery cells", KTH chemical Science and Engineering (2012) 42 pages.
Bloom et al., "An Investigation of the Impedance Rise and Power Fade in High-Power Li-Ion Cells", presented at the 19th Inernational Electric Vehicle Symposium (EVS-19) (Oct. 2002) 14, pages.
Bohlen et al., "Impedance Based Battery Diagnosis for Automotive Applications", 35th Annual IEEE Power Specialists Conference (2004) pp. 2192-2797.
Bose et al., "Lessons Learned in Using OHMIC Techniques for Battery Monitoring", IEEE (2001) pp. 99-104.

Christensen et al., "Using on-board Electrochemical Impedance Spectroscopy in Battery Management Systems", World Electric Vehicle Journal, vol. 6—ISSN 2032-6653 (2013) pp. 0793-0799.
Christophersen et al., "Advanced Technology Development Program for Lithium-Ion Batteries: Gen 2 Performance Evaluation Final Report", FreedomCAR & Vehicle Technoliges Program, INL/EXT-05-00913 (Jul. 2006) 140 pages.
Christensen et al., "Battery Technology Life Verification Testing and Analysis", Idaho National Laboratory INL/CON-07-12282 (Dec. 2007)12 pages.
Christensen et al., "Performance Evaluation of Gen3 Advanced Technology Development Cells", 214th ECE Meeting, Abstract #549, The Electrochemical Society, (2008), 1 page.
Christensen et al., "Pulse resistance effects due to charging or discharging of high-power lithium-ion cells: A path dependence study", Journal of Power Sources, 173 (2007) pp. 998-1005.
Cox et al., "Battery State of Health Monitoring, Combining Conductance Technology with Other Measurement Parameters for Real-Time Battery Performance Analysis", IEEE, 19-2 (2000) pp. 342-347.
Crow et al., "Integrated Prognostic Health Monitoring of Battery Health in Ground Robots", PennState Applied Research Laboratory, 32nd Association for Unmanned Vehicle Systems International Meeting (Jun. 2005) 16 pages.
Delaille et al., "Study of the 'coup de fouet' of lead-acid cells as a function of their state-of-charge and state-of-health", Journal of Power Sources, 158 (2006) pp. 1019-1028.
Diard et al., "Constant load vs constant current EIS study of electrochemical battery discharge", Electrochimica Acta, vol. 42, Nos. 23-24 (1997) pp. 3417-3420.
Diard et al., "EIS study of electrochemical battery discharge on constant load", Journal of Power Sources, 70 (1998) pp. 78-84.
Diard et al., "Impedance measurements of polymer electrolyte membrane fuel cells running on constant load", Journal of Power Sources, 74 (1998) pp. 244-245.
Donnellan et al., "Impedance Noise Identification", (May 2008) 72 pages.
Doughty et al., "Electrical Energy Storage System Abuse Test Manual for Electric and Hybrid Electric Vehicle Applications", FreedomCAR, SAND2005-3123 (Jun. 2005) 46 pages.
"FreedomCAR Ultracapacitor Test Manual", Idaho National Laboratory, DOE/ID-11173, Revision 0 (Sep. 2004) 116 pages.
Gould et al., "New Battery Model and State-of-Health Determination Through Subspace Parameter Estimation and State-Observer Techniques", IEEE Transactions on Vehicular Technology, vol. 58, No. 8 (Oct. 2009) pp. 3905-3916.
Hariprakash et al, "Monitoring sealed automotive lead-acid batteries by sparse-impedance spectroscopy", Proc. Indian Acad. Sci. (Chem. Sci.), vol. 115, Nos. 5&6 (Oct.-Dec. 2003) pp. 465-472.
Hariprakash et al., "On-line monitoring of lead-acid batteries by galvanostatic non-destructive technique", Journal of Power Sources 137 (2004) pp. 128-133.
Haskins et al., "Battery Technology Life Verification Test Manual", Idaho National Laboratory, INEEL/EXT-04-01986 (Feb. 2005) 133 pages.
Hlavac et al., "VRLA Battery Monitoring Using Conductance Technology", IEEE, 12-3 (1995) pp. 284-291.
Huang et al., "An Online Battery Impedance Measurement Method Using DC-DC Power Converter Control", IEEE Transactions on Inductrial Electronics, vol. 61, No. 11 (Nov. 2014) pp. 5987-5995.
Karden et al., "A method for measurement of interpretation of impedance spectra for industrial batteries", Journal of Power Sources, 85 (2000) pp. 72-78.
Kiel et al., "Validation of single frequency Z measurement for standby battery state of health determination", IEEE, 2-3 (2008) 7 pages.
Kozlowski, James D., "A Novel Online Measurement Technique for AC Impedance of Batteries and Other Electrochemical Systems", IEEE (2001) pp. 257-262.
Motloch et al., "High-Power Battery Testing Procedures and Analytical Methodologies for HEV's", 7, SAE Int. Passenger Cars Electron. Electr. Syst., vol. 111 (2002) pp. 797-802.

(56) References Cited

OTHER PUBLICATIONS

Noworolski et al., "Reducing and Utilizing Electrical Noises for Battery Monitoring Purposes", IEEE 32-4 (2004) pp. 511-614.
Okoshi et al., "Battery condition monitoring (BCM) technologies about lead-acid batteries", Journal of Power Sources 158 (2006) pp. 874-878.
Pop et al., "State-of-the-art of battery state-of-charge determination", Measurement Science and Technology, 16 (2005) R93-R110.
Saha et al., "Comparison of Prognostic Algorithms for Estimating Remaining Useful Life of Batteries", Transactions of the Institute of Measurement and Control, vol. 31, Issue 3-4 (2009) 10 pages.
Singh et al., "Fuzzy logic modeling of EIS measurements on lithium-ion batteries", Electrochimica Acta, 51 (2006) pp. 1673-1679.
"1260 Impedance/Gain-Phase Analyzer", Operating Manual, Solartron Analytical (Jan. 1996) 215 pages.
"1287 Electrochemical Interface", User Guide, Solartron Analytical (2001) 134 pages.
Sternad et al., "Condition monitoring of Lithium-Ion Batteries for electric and hybrid electric vehicles", Elektrotechnik & Informationstechnik, 126/5 (2009) pp. 186-193.
Tachibana et al., "Development of in situ a.c. impedance measurement system under constant-current conditions and its application to galvanostatic discharge of electrolytic manganese dioxide in alkaline solution" Journal of Power Sources 74 (1998) pp. 29-33.
Tang et al., "Temperature Dependent Performance and in Situ AC Impedance of High-Temperature PEM Fuel Cells Using the Nafion-112 Membrane", Journal of the Electrochemical Society, 153(11) (2006) pp. A2036-A2043.
Thomas et al., "Statistical methodology for predicting the life of lithium-ion cells via accelerated degradation testing", Journal of Power Sources, 184 (2008) pp. 312-317.
Unkelhaeuser et al., "Electrochemical Storage System Abuse Test Procedure Manual", United States Advanced Battery Consortium, SAND99-0497 (Jul. 1999) 28 pages.
Adany et al., "Switching algorithms for extending battery life in Electric Vehicles", Journal of Power Sources, 231 (2013) pp. 50-59.
Barsukov et al., "Challenges and Solutions in Battery Fuel Gauging", www.ti.com/lit/ml/slyp086/slyp086.pdf, Power Management Workbook. Texas Instruments Inc., (2004), 10 pages.
Brauer et al., "Residential Energy Storage from Repurposed Electric Vehicle Batteries: Market Overview and Development of a Service-Centered Business Model", IEEE 18th Conference on Business Informatics, (2016) pp. 143-152.
Brigham, "The Fast Fourier Transform", 1974, Prentice-Hall, Chapter 6 pp. 91-109.
Cabrera-Castillo et al, "Calculation of the state of safety (SOS) for lithium ion batteries", Journal of Power Sources 324 (2016) pp. 509-520.
Cheng et al., "Battery-Management System (BMS) and SOC Development for Electrical Vehicles", IEEE Transactions on Vehicular Technology, vol. 60, No. 1, (Jan. 2011) pp. 76-88.
Farmann et al., "Critical review of on-board capacity estimation techniques for lithium-ion batteries in electric and hybrid electric vehicles", Journal of Power Sources 281 (2015) pp. 114-130.
Guha et al., "Remaining Useful Life Estimation of Lithium-Ion Batteries based on the Internal Resistance Growth Model" Indian Control Conference (ICC), (2017) pp. 33-38.
Howey et al., "On-line measurement of battery impedance using motor controller excitation", IEEE Transactions on Vehicular Technology, vol. 63, Issue 6, (Jul. 2014) pp. 2557-2566.
Le et al., "Lithium-ion Battery State of Health Estimation Using Ah-V Characterization", Annual Conference of the Prognostics and Health Management Society, (2011) 7 pages.
Li et al., "Understanding the molecular mechanism of pulse current charging for stable lithium-metal batteries", Sci. Adv. 3, e1701246 (2017) 10 pages.
Lu et al., "A review on the key issues for lithium-ion battery management in electric vehicles", Journal of Power Sources 226 (2013) pp. 272-288.
Mingant et al., "Towards onboard Li-ion battery state-of-health diagnosis by a virtual sensor", World Electric Vehicle Journal, vol. 5 (2012) pp. 405-411, EVS26.
Morrison, "CSD Algorithms As Matlab Code for Real Time Estimation of Battery Impedance", Montana Tech of the University of Montana (Sep. 2005), 20 pages.
Pastor-Fernandez et al., "A Study of Cell-to-Cell Interactions and Degradation in Parallel Strings: Implications for the Battery Management System", Journal of Power Sources 329 (2016) pp. 574-585.
Pastor-Fernandez et al., "A Comparison between EIS and IC-DV as Li-ion Diagnostic Techniques to Identify and Duantify the Effects of Degradation Modes within BMS", Journal of Power Sources 360 (2017) pp. 301-318.
Qnovo "Fundamentals of Qnovo Adaptive Charging in Lithium Ion Batteries" http://qnovo.com/wp-content/uploads/2015/12/Qnovo_TechWhitePaper_v2.4.pdf, (2015) 13 pages.
Rahmoun et al., "Determination of the Impedance of Lithium-Ion Batteries using Methods of Digital Signal Processing", Energy Procedia 46 (2014) pp. 204 213.
Raijmakers et al., "Crosstalk Interferences on Impedance Measurements in Battery Packs ", IFAC-PapersOnLine 49(11) (2016) pp. 042-047.
Salehen et al., "Development of battery management systems (BMS) for electric vehicles (EVs) in Malaysia", MATEC Web of Conferences, 90, 01001 (2017), AiGEV 2016, 8 pages.
Sazhin et al., "Enhancing Li-Ion Battery Safety by Early Detection of Nascent Internal Shorts", Journal of the Electrochemical Society, 164 (1), (2017) pp. A6281-A6287.
Schweiger et al., "Comparison of Several Methods for Determining the Internal Resistance of Lithium Ion Cells", Sensors, 10, (2010) pp. 5604-5625.
Socher et al., "Improving the functional safety of automotive batteries using in-situ impedance spectroscopy", Transportation Research Procedia 14 (2016) pp. 3661-3666.
Srivastav et al., "State-of-charge indication in Li-ion batteries by simulated impedance spectroscopy", J Appl Electrochem 47 (2017) pp. 22+236.
Stroe et al., "Diagnosis of Lithium-Ion Batteries State-of-Health based on Electrochemical Impedance Spectroscopy Technique", Proceedings of the 2014 Energy Conversion Congress and Exposition (ECCE) IEEE Press, pp. 1576-4582.
Taberna et al., "Electrochemical Characteristics and Impedance Spectroscopy Studies of Carbon-Carbon Supercapacitors", Journal of the Electrochemical Society, 150(3), (2003) pp. A292-A300.
Weng et al., "On-board state of health monitoring of lithium-ion batteries using incremental capacity analysis with support vector regression", Journal of Power Sources 235 (2013) pp. 36-44.
Wu et al., "A Review on Fault Mechanisms and Diagnosis Approach for Li-Ion Batteries", Journal of Nanomaterials, Article ID 631263 (2015) 10 pages.
Xing et al., "Battery Management Systems in Electric and Hybrid Vehicles", Energies 2011, 4, pp. 1840-1857.
Xing et al., "Prognostics and Health Monitoring for Lithium-ion Battery", Proceedings of the IEEE International conference on Intelligence and Security Informatics, (2011) pp. 242-247.
Zhang et al., "Prediction of Lithium-Ion Batterl s Remaining Useful Life Based on Relevance Vector Machine", SAE Int. J. Alt. Power 5(1) (May 2016) pp. 30-40.
Zou et al., "Combined State of Charge and State of Health estimation over lithium-ion battery cell cycle lifespan for electric vehicles", Journal of Power Sources 273 (2015) pp. 793-803.

\* cited by examiner

ENERGY STORAGE CELL IMPEDANCE MEASURING APPARATUS, METHODS AND RELATED SYSTEMS

STATEMENT REGARDING FEDERALLY SPONSORED RESEARCH OR DEVELOPMENT

The invention was made with government support under Contract No. DE-AC07-05-ID14517, awarded by the United States Department of Energy. The government has certain rights in this invention.

CROSS-REFERENCE TO RELATED APPLICATIONS

This application is related to U.S. patent application Ser. No. 13/438,741, filed Apr. 3, 2012, now U.S. Pat. No. 9,244,130, issued Jan. 1, 2016, which is a continuation of U.S. patent application Ser. No. 12/217,013, filed Jun. 30, 2008, now U.S. Pat. No. 8,150,643, issued Apr. 3, 2012, which is a continuation-in-part of U.S. patent application Ser. No. 11/825,629, filed Jul. 5, 2007, now U.S. Pat. No. 7,395,163, issued Jul. 1, 2008, which is a continuation of U.S. patent application Ser. No. 11/313,546, filed Dec. 20, 2005, now abandoned, which claims the benefit of U.S. Provisional Patent Application Nos. 60/637,969, filed Dec. 20, 2004, and 60/724,631, filed Oct. 7, 2005. This application is also related to U.S. patent application Ser. No. 12/813,750, filed Jun. 11, 2010, now U.S. Pat. No. 8,868,363, issued Oct. 21, 2014, which claims priority to U.S. Provisional Patent Application No. 61/186,358, filed Jun. 11, 2009; and this application is also related to U.S. patent application Ser. No. 12/772,880, filed May 3, 2010, now U.S. Pat. No. 8,352,204, issued Jan. 8, 2013, which is a continuation-in-part of U.S. patent application Ser. No. 12/217,013, filed Jun. 30, 2008, now U.S. Pat. No. 8,150,643, issued Apr. 3, 2012; and this application is also related to U.S. patent application Ser. No. 13/100,170, filed May 3, 2011, now abandoned, which claims priority to U.S. Provisional Patent Application No. 61/330,766, filed May 3, 2010; and this application is also related to U.S. patent application Ser. No. 13/100,184, filed May 3, 2011, now U.S. Pat. No. 8,762,109, issued Jun. 24, 2014, which claims priority to U.S. Provisional Patent Application No. 61/330,733, filed May 3, 2010. The disclosure of each of the foregoing applications and patents is hereby incorporated by reference in its entirety, including all figures, tables and drawings.

BACKGROUND

The present disclosure relates to apparatus and methods for impedance measurement and, more specifically, to impedance measurement in energy storage cells employed in rechargeable service, as well as systems including such cells. Specific applications, without limitation, include impedance measurement of relatively high voltage energy storage cells.

Chemical changes to electrodes in a rechargeable battery may cause degradation in the battery's capacity, and other functional parameters. Battery degradation may accumulate over the life of the battery. Environmental factors (e.g., high temperature) and functional factors (e.g., improper charging and discharging) may accelerate battery degradation. Operators of systems that rely on rechargeable battery power may desire to monitor the degradation of the batteries they use.

One indicator of battery degradation is an increase in battery impedance. FIG. 1 is an impedance (real and imaginary) plot 102 (similar to a Nyquist plot) of a fresh battery and an impedance plot 104 of an aged battery, measured at several different frequencies using an Electrochemical Impedance Measurement (EIM) system. As illustrated in FIG. 1, the aged battery shows a higher impedance than the fresh battery at each of the different frequencies. Operators of systems that rely on rechargeable batteries may use impedance data, such as the EIM data of FIG. 1, to determine that a replacement battery is needed before a failure occurs. Such preemptive replacement may prevent expensive delays and property damage that may occur in the event of a battery failure. Also, knowledge of a battery's continued reliability may prevent expenses associated with unnecessarily replacing a battery that still has a substantial amount of lifetime left.

EIM systems use the Bode analysis technique to characterize an impedance of an electrochemical process. The Bode analysis technique is a well-established and proven technique. In EIM systems, a battery being evaluated is excited with an AC current of a single frequency, and a response is measured. The process is repeated over a range of frequencies of interest until the spectrum of the impedance is obtained. The EIM method is effective, but time consuming, as the process is serial (e.g., the impedance is measured separately and sequentially for each of the different frequencies of interest).

A parallel approach using bandwidth limited noise as an excitation current to the battery can obtain similar impedance information of the battery in less time. System response to the noise is processed via correlation and Fast Fourier Transform (FFT) algorithms, and many such responses are averaged. The result is the spectrum of response over the desired frequency range. The averaging of many responses makes this process somewhat serial (e.g., separate excitations are sequentially applied to the battery, and respective responses are measured). As a result, this process is also somewhat time consuming, similar to the EIM system discussed above. Another technique assembles the current noise waveform from a sum of sinusoids, each at a different frequency. The system response as a time record is acquired and processed with the FFT algorithm. To reduce noise, multiple time records of waveforms are processed and their resultant spectra are averaged. This process is similarly somewhat serial, and therefore, is also somewhat time consuming.

BRIEF SUMMARY

Disclosed in some embodiments herein is an energy storage impedance measuring device including a sum of sinusoids (SOS) current excitation circuit, and control circuitry. The SOS current excitation circuit includes differential current sources configured to isolate a ground terminal of the differential current from a positive terminal and a negative terminal of an energy storage cell. The SOS current excitation circuitry is configured to apply an SOS signal through the energy storage cell. The SOS signal includes a sum of a plurality of sinusoidal current signals. Each of the plurality of sinusoidal current signals oscillates at a different one of a plurality of different frequencies. The control circuitry is configured to operably couple to the SOS current excitation circuit, the positive terminal, and the negative terminal. The control circuitry includes an SOS control module, at least one signal measuring module, and an impedance computation module. The SOS control module is configured to cause the SOS current excitation circuit to produce the SOS signal. The at least one signal measuring module is configured to measure electrical signals on the positive terminal and the negative terminal of the battery cell. The impedance computation module is configured to use the electrical signals measured by the at least one signal measuring module to compute an impedance of the battery for each frequency of the SOS signal.

Disclosed in some embodiments herein is a method of measuring impedance of an energy storage cell. The method includes applying a sum-of-sinusoids (SOS) signal including a sum of sinusoidal current signals to an energy storage cell with an SOS current excitation circuit including differential current sources. Each of the sinusoidal current signals oscillates at a different one of a plurality of different frequencies. The method also includes measuring an electrical signal at a positive terminal and a negative terminal of the energy storage cell. The method further includes computing an impedance of the energy storage cell at each of the plurality of different frequencies using the measured electrical signal.

Disclosed in some embodiments herein is an energy storage cell impedance measuring circuit including differential current sources and a high voltage buffer. The differential current sources include a push current source configured to operably couple to a positive terminal of an energy storage cell, a pull current source configured to operably couple to a negative terminal of the energy storage cell, and a ground terminal of the differential current sources operably coupled between the push current source and the pull current source. The high voltage buffer is operably coupled to at least one of the push current source and the pull current source. The high voltage buffer is configured to isolate the at least one of the push current source and the pull current source form a direct current voltage provided by the energy storage cell. The differential current source is configured to apply a sum-of-sinusoids (SOS) signal through the positive terminal and the negative terminal of the energy storage cell.

Disclosed in some embodiments herein is an impedance measuring system. The impedance measuring system includes one or more energy storage cells, and an energy storage cell impedance measuring system operably coupled to the one or more energy storage cells. The energy storage cell impedance measuring system includes sum-of-sinusoids (SOS) current excitation circuitry including differential current sources. The SOS current excitation circuitry is configured to apply SOS signals to the one or more energy storage cells. The SOS signals include sums of a plurality of sinusoidal current signals. Each of the plurality of sinusoidal current signals include a different one of a plurality of different frequencies. The energy storage cell impedance measuring system also includes control circuitry operably coupled to the SOS current excitation circuit and the one or more energy storage cells. The control circuitry is configured to control the SOS current excitation circuitry, measure electrical signals at terminals of the one or more energy storage cells responsive to the SOS signals, and compute impedances of the energy storage cells.

DETAILED DESCRIPTION

Figure 1:
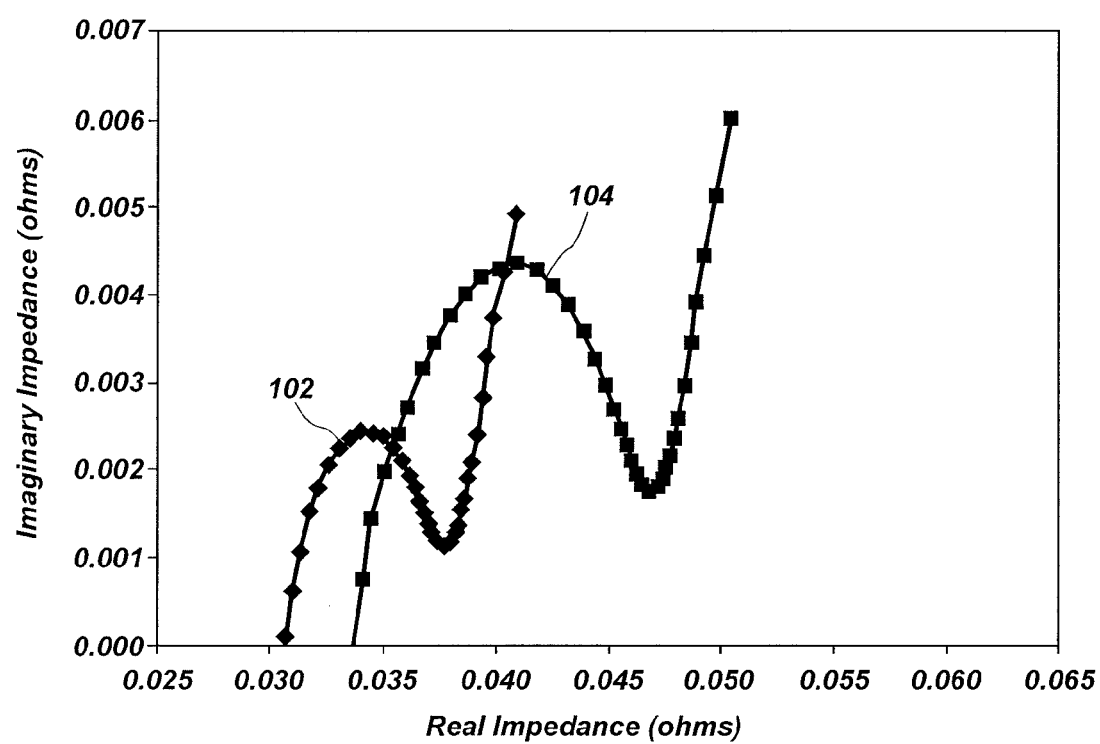
FIG. 1 is an impedance plot of a fresh battery and an impedance plot of an aged battery, measured at several different frequencies using an Electrochemical Impedance Measurement (EIM) system.

In the following detailed description, reference is made to the accompanying drawings, which form a part hereof, and in which is shown by way of illustration specific embodiments in which the present disclosure may be practiced. These embodiments are described in sufficient detail to enable those of ordinary skill in the art to practice the present disclosure. It should be understood, however, that the detailed description and the specific examples, while indicating examples of embodiments of the present disclosure, are given by way of illustration only and not by way of limitation. From this disclosure, various substitutions, modifications, additions rearrangements, or combinations thereof within the scope of the present disclosure may be made and will become apparent to those of ordinary skill in the art.

In accordance with common practice, the various features illustrated in the drawings may not be drawn to scale. The illustrations presented herein are not meant to be actual views of any particular apparatus (e.g., device, system, etc.) or method, but are merely idealized representations that are employed to describe various embodiments of the present disclosure. Accordingly, the dimensions of the various features may be arbitrarily expanded or reduced for clarity. In addition, some of the drawings may be simplified for clarity. Thus, the drawings may not depict all of the components of a given apparatus or all operations of a particular method.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the present disclosure may be implemented on any number of data signals including a single data signal.

The various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and acts are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the disclosure described herein.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be rearranged. A process may correspond to a method, a function, a procedure, a subroutine, a subprogram, etc. Furthermore, the methods disclosed herein may be implemented in hardware, software, or both. If implemented in software, the functions may be stored or transmitted as one or more computer-readable instructions (e.g., software code) on a computer-readable medium. Computer-readable media may include both computer storage media and communication media including any medium that facilitates transfer of a computer program from one place to another. Computer-readable media may include volatile and non-volatile memory, such as, for example, magnetic and optical storage devices, such as, for example, hard drives, disk drives, magnetic tapes, CDs (compact discs), DVDs (digital versatile discs or digital video discs), solid state storage devices (solid state drives), and other similar storage devices.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Elements described herein may include multiple instances of the same element. These elements may be generically indicated by a numerical designator (e.g., 500) and specifically indicated by the numerical indicator followed by a numeric indicator followed by a letter (e.g., 500A). For ease of following the description, for the most part, element number indicators begin with the number of the drawing on which the elements are introduced or most fully discussed. Thus, for example, element identifiers on a FIG. 1 will be mostly in the numerical format 1xx and elements on a FIG. 3 will be mostly in the numerical format 3xx.

As used herein, the terms "energy storage cell" and "energy storage cells" refer to rechargeable electrochemical cells that convert chemical energy to a direct current electrical voltage potential across a positive terminal and a negative terminal of the energy storage cell. The terms "battery," "cell," and "battery cell" may be used interchangeably herein with the term "energy storage cell."

As used herein, the terms "sinusoid," and "sinusoidal," refer to electrical signals (e.g., currents and voltage potentials) that oscillate at least substantially according to a sine or cosine function (e.g., having various magnitudes and phase shifts) over time. As should be readily apparent to those of ordinary skill in the art, any given sinusoidal signal may be equivalently expressed either as a sine function or a cosine function, as the sine and cosine are merely phase-shifted versions of each other. Sinusoidal signals are disclosed herein as being applied to energy storage cells and shunts (e.g., resistors of known resistance values for calibration purposes). In some cases, these sinusoidal signals are referred to more specifically herein as either sine signals or cosine signals. These specific references to sine signals and cosine signals may be indicative of the phase of such signals relative to a time when a sinusoidal signal is first asserted to a conductive line (e.g., a positive or negative battery terminal, a conductive trace on a circuit board, a wire, etc.).

As used herein, the term "sum-of-sinusoids" ("SOS") refers to electrical signals that oscillate according to a sum of sinusoidal signals. An SOS signal may include sums of sine signals, sums of cosine signals, or combinations thereof. For example, a harmonic orthogonal synchronous transform (HOST) SOS may include a base sinusoidal signal having a base frequency summed with one or more sinusoidal signals having successive integer harmonic frequencies of the base frequency, and alternating between sine signals and cosine signals (or some phase-shifted version thereof) for each successive harmonic. The orthogonal nature of the harmonic sinusoidal signals summed together in a HOST SOS may serve to reduce or eliminate excessive transients.

Figure 2:
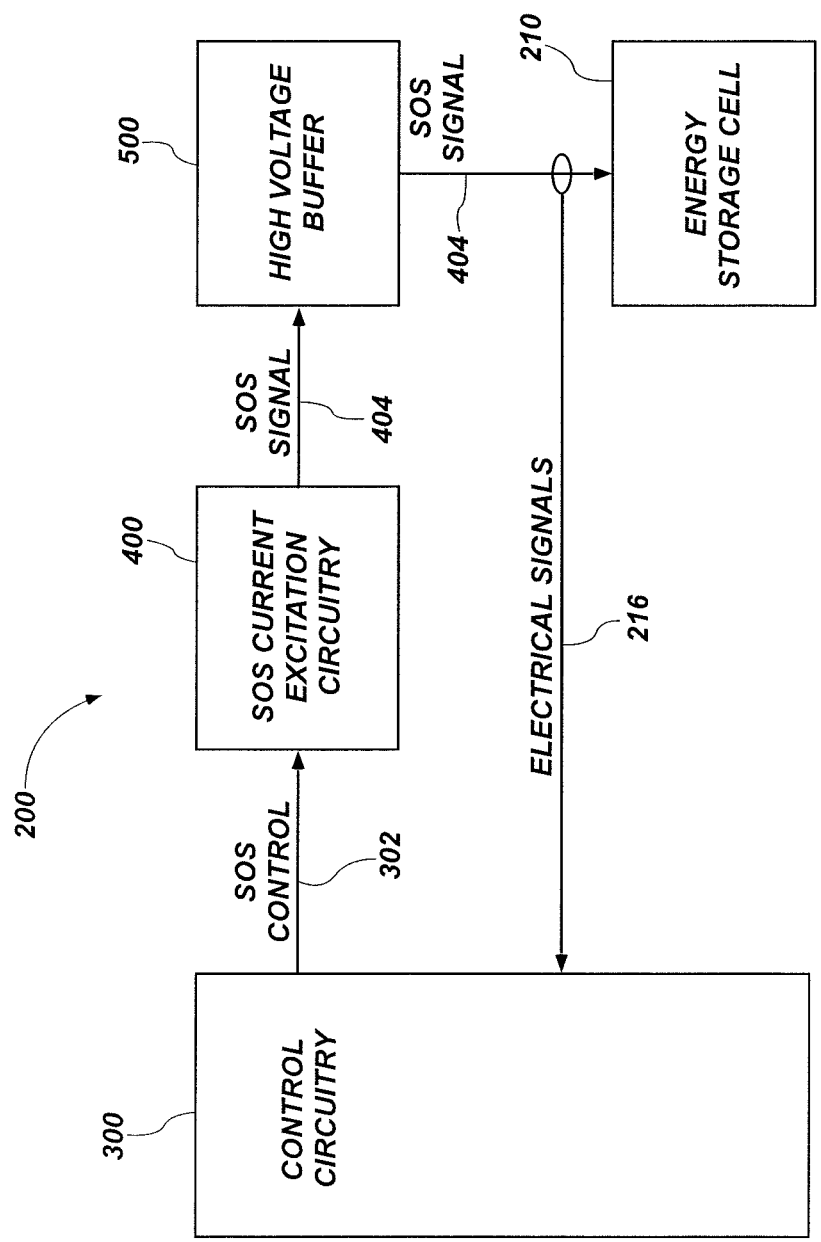
FIG. 2 is a simplified block diagram of an energy storage cell impedance measuring system.

FIG. 2 is a simplified block diagram of an energy storage cell impedance measuring system 200. The energy storage cell impedance measuring system 200 may include control circuitry 300 operably coupled to SOS current excitation circuitry 400 and an energy storage cell 210. The energy storage cell impedance measuring system 200 may also include a high voltage buffer 500 operably coupled between the SOS current excitation circuitry 400 and the energy storage cell 210.

The control circuitry 300 may be configured to control the SOS current excitation circuitry 400. By way of non-limiting example, the control circuitry 300 may be configured to apply an SOS control signal 302 to the SOS current excitation circuitry 400 to control an SOS signal 404 outputted by the SOS current excitation circuitry 400. The SOS control signal 302 may be selected to cause the SOS current excitation circuitry 400 to provide an SOS signal 404 including a sum of a plurality of different current signals (e.g., a HOST SOS signal) having a plurality of different frequencies of interest for testing impedance of the energy storage cell 210. In some embodiments, the SOS control signal 302 may include a voltage signal proportional to a desired current signal for the SOS signal 404 at the output of the SOS current excitation circuitry 400. Accordingly, the SOS control signal 302 may include an SOS voltage signal.

The control circuitry 300 may also be operably coupled to the energy storage cell 210 and configured to measure electrical signals 216 at terminals of the energy storage cell 210 responsive to an SOS signal 404 applied to the terminals of the energy storage cell 210. The control circuitry 300 may be configured to compute the impedance of the energy storage cell 210 at the frequencies of the SOS signal 404 using the measured electrical signals 216. In this way, the control circuitry 300 may be configured to work with the SOS current excitation circuitry 400 to test the impedance of the energy storage cell 210 at a plurality of different frequencies substantially simultaneously.

In some embodiments, the control circuitry 300 may be configured to measure a voltage response and a current response of the energy storage cell 210 to the SOS signal 404, and divide the measured voltage response by the measured current response to obtain the impedance response of the energy storage cell 210. In such embodiments, no calibration may be needed because the impedance of the energy storage cell 210 may be determined by dividing a measured voltage by a measured current.

In some embodiments, the control circuitry 300 may be configured to measure only a voltage response of the energy storage cell 210 to the SOS signal 404. In such embodiments, calibration may be needed to determine the impedance of the energy storage cell 210. By way of non-limiting example, a method of single-shunt calibration is discussed below with reference to FIG. 8. In some embodiments, multiple shunt (e.g., resistive shunts) calibration may be used to account for real and imaginary portions of signals.

More detail regarding the control circuitry 300 will be discussed below with reference to FIGS. 3A and 3B.

The SOS current excitation circuitry 400 may be configured to receive the SOS control signal 302 from the control circuitry 300 and generate an SOS signal 404. The SOS current excitation circuitry 400 may be configured to apply the SOS signal 404 to the energy storage cell 210. In some embodiments, the SOS current excitation circuitry 400 may be configured to apply the SOS signal 404 to the energy storage cell 210 through the high voltage buffer 500. It should be noted that the impedance of the energy storage cell 210 may, in some embodiments, be determined without the high voltage buffer 500. By way of non-limiting example, U.S. Patent Publication No. 2012/0262186 to Morrison et al., filed Apr. 3, 2012, the entire disclosure of which is incorporated herein by this reference, discloses measuring impedance of an energy storage device without such a high voltage buffer 500.

The SOS signal 404 may include a sum of sinusoidal current signals having frequencies of interest for energy storage cell 210 impedance measurements. In some embodiments, the SOS current excitation circuitry 400 may include differential current sources including a push current source configured to push current into the energy storage cell 210 and a pull current source configured to pull current from the energy storage cell 210. The push current source and the pull current source may each include an operational amplifier current source, and form a balanced differential current source, as will be discussed in more detail below with reference to FIG. 6.

The high voltage buffer 500 may be configured to isolate at least one signal line of the SOS current excitation circuitry 400 providing the SOS signal 404 from a direct current voltage sourced by the energy storage cell 210. Accordingly, an analog ground of the SOS current excitation circuitry 400 may be electrically isolated from a power terminal of the energy storage cell 210. As a result, sensitive electronics included in the SOS current excitation circuitry 400 may not be exposed to the extremes of the direct current voltage potential sourced by the energy storage cell 210. Also, the SOS current excitation circuitry 400 may be subjected to less noise than if the analog ground were extended outside of the SOS current excitation circuitry 400.

The high voltage buffer 500 may also be configured to pass the SOS signal 404 to the energy storage cell 210. In some embodiments, the high voltage buffer 500 may include a high-pass filter. In some embodiments, the high voltage buffer 500 may include at least one capacitor operably coupled in series between the SOS current excitation circuitry 400 and the energy storage cell 210.

In operation, the control circuitry 300 may provide the SOS control signal 302 to the SOS current excitation circuitry 400. The SOS control signal 302 may cause the SOS current excitation circuitry 400 to output an SOS signal 404 (e.g., a HOST SOS signal). The high voltage buffer 500 may pass the SOS signal 404 to the terminals of the energy storage cell 210, while buffering the SOS current excitation circuitry 400 from the direct current voltage potential sourced by the energy storage cell 210. Electrical signals 216 (e.g., a voltage response, a current response, or a combination thereof) at terminals of the energy storage cell 210 responsive to the SOS signal 404 may be measured by the control circuitry 300. The control circuitry 300 may determine the impedance of the energy storage cell 210 at each of the plurality of frequencies of the SOS signal 404 by analyzing the electrical signals 216.

Figure 3A:
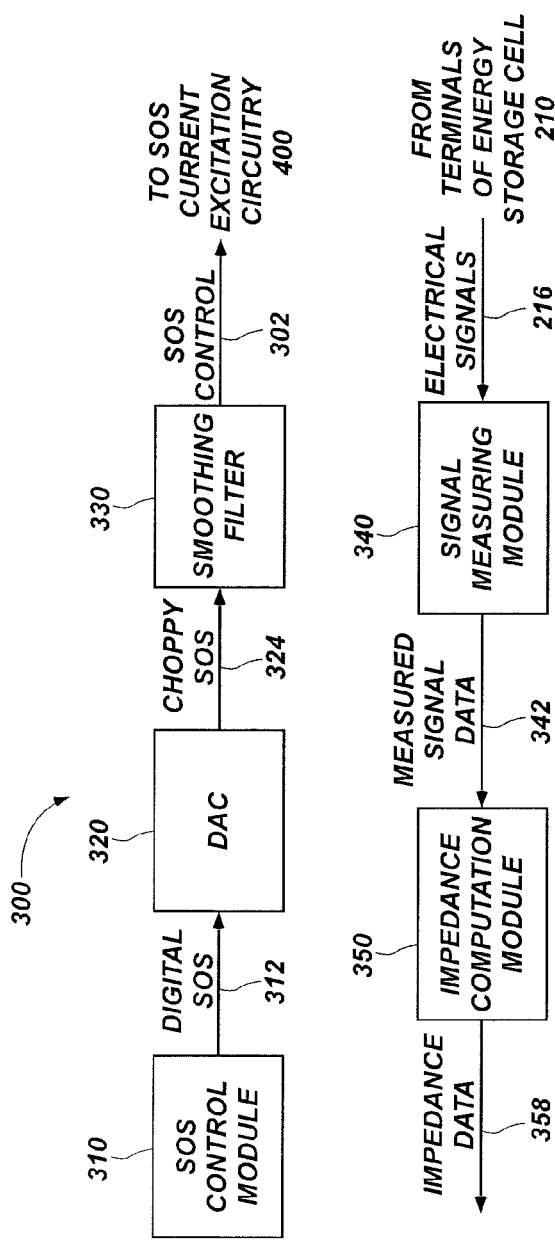
FIG. 3A is a simplified block diagram of a control circuitry of FIG. 2.

FIG. 3A is a simplified block diagram of the control circuitry 300 of FIG. 2. The control circuitry 300 may include an SOS control module 310, a digital-to-analog converter (DAC) 320, a smoothing filter 330, a signal measuring module 340, and an impedance computation module 350. The SOS control module 310 may be configured to generate a digital SOS signal 312 including a sum of sinusoids having a plurality of different frequencies that are of interest for impedance measurement of an energy storage cell 210 (FIG. 2). The digital SOS signal 312 may be sampled at least at a Nyquist rate of a highest one of the plurality of different frequencies of the digital SOS signal 312. The digital SOS signal 312 may also represent at least one period of a lowest one of the plurality of different frequencies of the digital SOS signal 312. The SOS control module 310 may be configured to provide the digital SOS signal 312 to the DAC 320.

The DAC 320 may be configured to convert the digital SOS signal 312 to a choppy SOS signal 324. As those of ordinary skill in the art should understand, digital signals, such as the digital SOS signal 312, are only capable of manifesting a discrete set of discontinuous signal levels. As a result, when digital signals are converted to analog signals, the analog equivalent manifests stepwise, or "choppy" fluctuations. Thus, the choppy SOS signal 324 provided by the DAC 320 may manifest stepwise fluctuations. The DAC 320 may be configured to provide the choppy SOS signal 324 to the smoothing filter 330.

The smoothing filter 330 may be configured to smooth the choppy SOS signal 324 to provide a smooth SOS control signal 302. By way of non-limiting example, the smoothing filter 330 may include a low-pass filter configured to smooth the stepwise fluctuations of the choppy SOS signal 324. The SOS control signal 302 may be provided to the SOS current excitation circuitry 400 (FIG. 2).

As should be appreciated by those of ordinary skill in the art, a filter may alter a magnitude, phase, or combination thereof, of periodic signals. It should also be appreciated that filters may alter the magnitude and phase of different components of signals oscillating at different frequencies in different ways. Accordingly, each of the different frequency components of the SOS control signal 302 may be altered in magnitude, frequency, or a combination thereof, from the corresponding magnitude and frequency of the different frequency components of the digital SOS signal 312, due at least in part to the smoothing filter 330.

In some embodiments, properties of the smoothing filter 330 may be known to analytically estimate the frequency response of smoothing filter 330. In some embodiments, calibration may be used to determine the frequency response to the smoothing filter 330. The SOS control module 310 may use the frequency response of the smoothing filter 330 to take into account expected changes in magnitude, phase, or a combination thereof, that the smoothing filter 330 is expected to impose on the different frequency components of the control signal 302. The SOS control module 310 may compensate for the expected changes when generating the digital SOS signal 312. In other words, the SOS control module 310 may be configured to pre-emphasize the digital SOS signal 312 to compensate for the response of the smoothing filter 330. By way of non-limiting example, if the smoothing filter 330 is expected to attenuate and shift a first frequency component of the choppy SOS signal 324 by known amounts, the SOS control module 310 may preemptively increase the magnitude and shift the phase of the corresponding first frequency component of the digital SOS signal 312 by the known amounts to compensate for the expected changes.

Once the SOS control signal 302 has been provided to the SOS current excitation circuitry 400, and a corresponding SOS signal 404 (FIG. 2) is applied to the energy storage cell 210, the signal measuring module 340 may measure electrical signals 216 at the terminals of the energy storage cell 210. By way of non-limiting example, the signal measuring module 340 may be configured to measure a voltage response of the energy storage cell 210 to the SOS signal 404, a current response of the energy storage cell 210 to the SOS signal 404, or a combination thereof. The signal measuring module 340 may be configured to provide the impedance computation module 350 measured signal data 342 indicating the measured response of the energy storage cell 210 to the SOS signal 404.

The impedance computation module 350 may be configured to compute a determined impedance of the energy storage cell 210 using the measured signal data 342 from the signal measuring module 340. By way of non-limiting example, the measured signal data may include both the voltage response and the current response of the energy storage cell 210 to the SOS signal 404 (FIG. 2). The impedance computation module 350 may be configured to divide the voltage response by the current response for each of the plurality of different frequencies of the SOS signal 404 to determine the impedance for each of the plurality of different frequencies.

Also by way of non-limiting example, the measured signal data 342 may include only the voltage response of the energy storage cell 210 to the SOS signal 404. The impedance computation module 350 may be configured to estimate the current response using the voltage response and calibration data from previous or subsequent calibrations of the control circuitry 300. A known calibration response may be measured by applying the SOS signal 404 to one or more shunts of known impedance, and measuring and storing calibration data including the response of the one or more shunts to the SOS signal 404. For example, a method for calibrating the control circuitry 300 using a single shunt is discussed below with reference to FIG. 8.

The impedance computation module 350 may be configured to provide or store impedance data including the determined impedance of the energy storage cell 210 at each of the frequencies included in the digital SOS signal 312 (i.e., the same frequencies included in the choppy SOS signal 324, the SOS control signal 302, and the SOS signal 404). In some embodiments, the impedance data may be displayed to a user of the energy storage cell impedance measuring system 200 (FIG. 2) (e.g., on an electronic display of the energy storage cell impedance measuring system 200 in list form, in plot form, in table form, etc.). In some embodiments, the impedance data may be processed automatically to determine whether the energy storage cell 210 should be replaced, and the user may be informed of the automatic determination. In some embodiments, the impedance data may be processed automatically to determine an estimate of how much life is remaining to the energy storage cell 210. Such automatic processing may be performed locally by the control circuitry 300 (e.g., by processing elements 360 operably coupled to data storage devices 370 (FIG. 3B)), remotely by a computing device (e.g., a personal computer, a tablet, a smart phone, a server, an automobile computer, other computing devices, etc.) configured to communicate with the control circuitry 300, or combinations thereof.

Figure 3B:
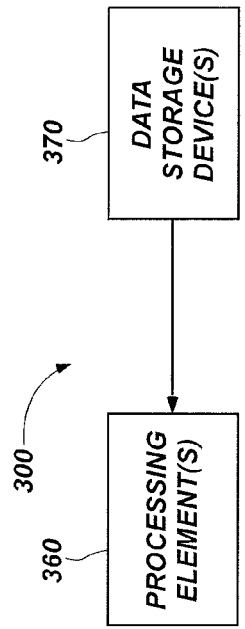
FIG. 3B is another simplified block diagram of the control circuitry of FIG. 2, according to some embodiments of the disclosure.

FIG. 3B is another simplified block diagram of the control circuitry 300 of FIG. 2, according to some embodiments of the disclosure. In some embodiments, the control circuitry 300 may include at least one processing element 360 operably coupled to at least one data storage device 370. The data storage device 370 may include computer-readable instructions configured to instruct the at least one processing element 360 to perform the functions of at least one of the SOS control module 310, the digital-to-analog converter 320, the smoothing filter 330, the signal measuring module 340, and the impedance computation module 350.

The at least one processing element 360 may include an electrical circuit configured to execute the computer-readable instructions stored in the at least one data storage device 370. By way of non-limiting example, the at least one processing element 360 may include a microcontroller, a central processing unit (CPU), a programmable logic controller (PLC), a digital signal processor (DSP), other processing elements, and combinations thereof. In some embodiments, the at least one processing element 360 may be implemented in a same semiconductor package as the at least one data storage device 370 (e.g., a microcontroller with on-board memory, etc.). In some embodiments, the at least one processing element 360 may be implemented in separate packages from the at least one data storage device 370.

The at least one data storage device 370 may include volatile (e.g., random access memory (RAM)) or non-volatile (e.g., read-only memory (ROM)) data storage. By way of non-limiting example, the at least one data storage device 370 may include Flash memory, a hard disk, a solid state drive, cloud storage, electrically programmable read-only memory (EPROM), other data storage, and combinations thereof.

In some embodiments, the control circuitry 300 may include one or more hardware implemented modules. By way of non-limiting example, at least one of the SOS control module 310, the DAC 320, the smoothing filter 330, the signal measuring module 340, and the impedance computation module 350 may be implemented in hardware (e.g., a system on chip (SoC), an application specific integrated circuit (ASIC), a circuit built from discrete circuit components, etc.).

Figure 4A:
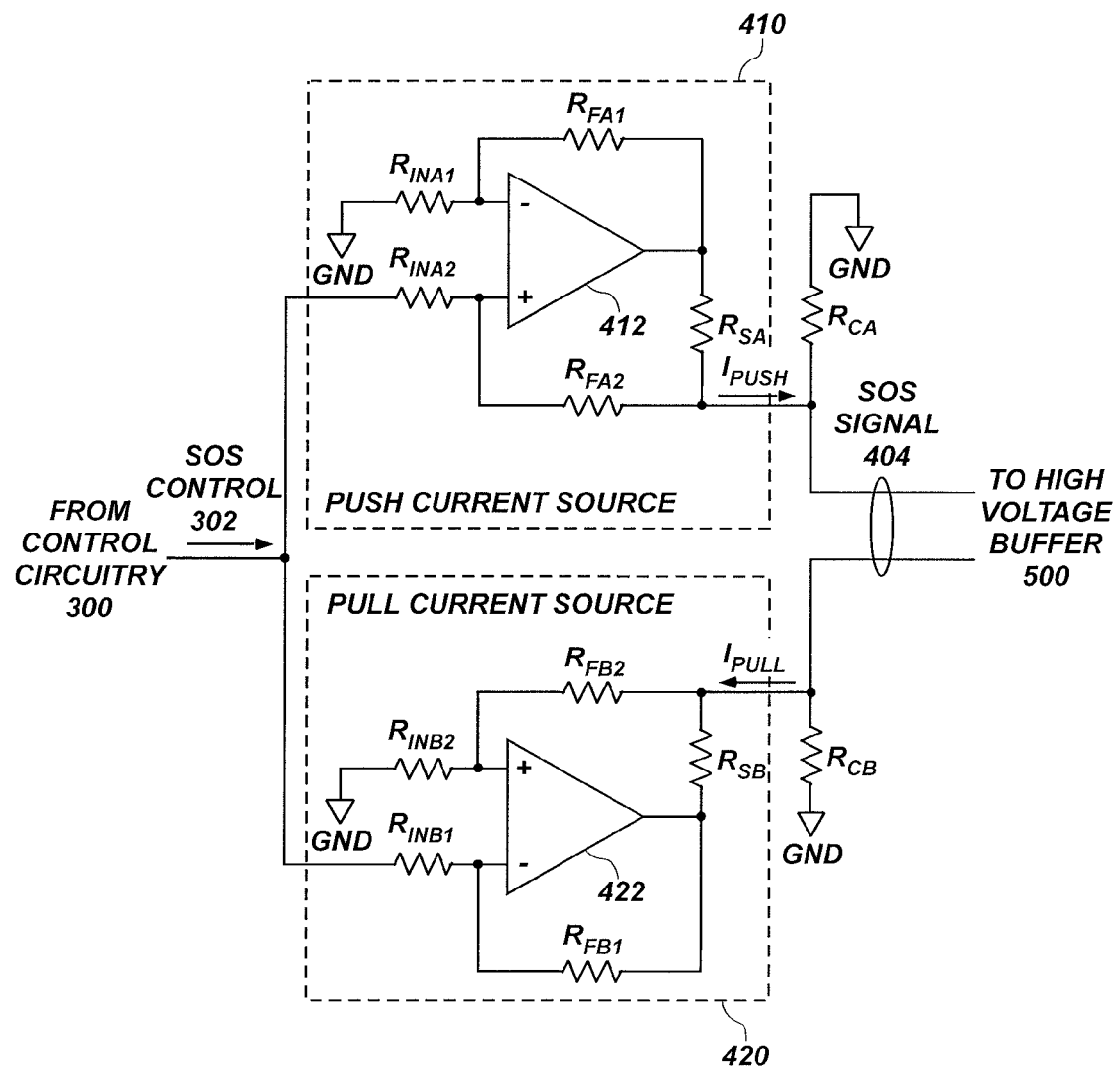
FIG. 4A is a simplified circuit schematic illustration of the SOS current excitation circuitry of FIG. 2.
Figure 4B:
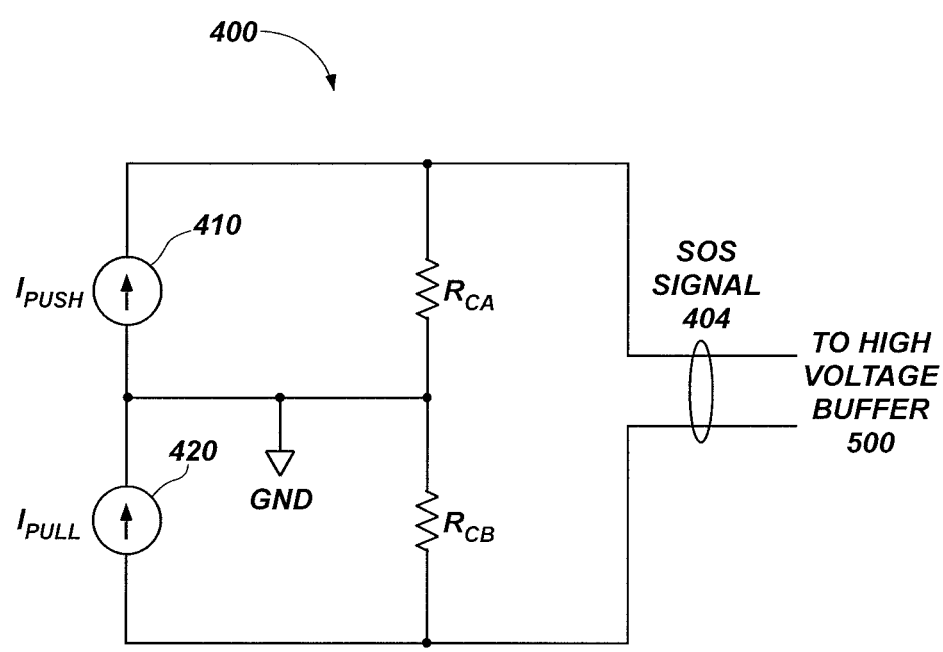
FIG. 4B is a simplified equivalent circuit schematic illustration of the SOS current excitation circuitry of FIG. 4A.

FIG. 4A is a simplified circuit schematic illustration of the SOS current excitation circuitry 400 of FIG. 2. FIG. 4B is a simplified equivalent circuit schematic illustration of the SOS current excitation circuitry 400 of FIG. 4A. Referring to FIGS. 4A and 4B together, the SOS current excitation circuitry 400 may include a push current source 410 and a pull current source 420 (i.e., a push-pull current driver, also referred to herein as "differential current sources" 410, 420). The push current source 410 may be configured to push current $I_{PUSH}$ into the energy storage cell 210 (FIG. 2), and the pull current source 420 may be configured to pull current $I_{PULL}$ from the energy storage cell 210 (e.g., through the high voltage buffer 500). As is apparent from FIG. 4B, the analog ground terminal GND of the SOS current excitation circuitry 400 is floated between the push current source 410 and the pull current source 420, isolating the analog ground terminal GND from the terminals of the energy storage cell 210. The push current source 410 and the pull current source 420 may be high impedance current sources. As a result, the SOS current excitation circuitry 400 may be fully high impedance ground isolated.

The push current source 410 and the pull current source 420 may be configured to receive the SOS control signal 302 and provide the SOS signal 404 to the high voltage buffer 500. The SOS signal 404 may include a current signal that is proportional to a voltage potential of the SOS control signal 302, as will be discussed in more detail below.

In some embodiments, the push current source 410 may include an operational amplifier 412 operably coupled to resistors $R_{INA1}$, $R_{INA2}$, $R_{FA1}$, $R_{FA2}$, and $R_{SA}$ in an operational amplifier current source configuration. Input resistors $R_{INA1}$ and $R_{INA2}$ may be operably coupled to the inverting input and the non-inverting input, respectively, of the operational amplifier 412. The non-inverting input of the operational amplifier 412 may be configured to receive the SOS control signal 302 through the resistor $R_{INA2}$. The inverting input of the operational amplifier 412 may be operably coupled to analog ground GND through resistor $R_{INA1}$. Resistors $R_{INA1}$ and $R_{INA2}$ may be selected to have the same resistance value $R_{INA}$.

The inverting input of the operational amplifier 412 may also be operably coupled to an output of the operational amplifier 412 through resistor $R_{FA1}$. The non-inverting input of the operational amplifier 412 may be operably coupled to the output of the operational amplifier 412 through resistors $R_{FA2}$ and $R_{SA}$. The resistance of $R_{FA1}$ and $R_{FA2}$ may be selected to have the same resistance value $R_{FA}$. An output of the push current source 410 may be located between resistors $R_{FA2}$ and $R_{SA}$. Accordingly, a push portion of the SOS signal 404 may be provided between resistors $R_{FA2}$ and $R_{SA}$. Thus configured, the push portion of the SOS signal 404 provided by the push current source 410 may be expressed as:

$$I_{PUSH} = V_{SOSCONTROL} \frac{R_{FA}}{R_{INA} R_{SA}},$$

where $I_{PUSH}$ is the current provided by the push current source 410, and $_{SOSCONTROL}$ is the voltage potential of the SOS control signal 302. As may be seen by inspecting this expression, the $I_{PUSH}$ is proportional to $V_{SOS\ CONTROL}$.

In some embodiments, the pull current source 420 may include an operational amplifier 422 operably coupled to resistors $R_{INB1}$, $R_{INB2}$, $R_{FB1}$, $R_{RB2}$, and $R_{SB}$ in an operational amplifier current source configuration. Input resistors $R_{INB1}$ and $R_{INB2}$ may be operably coupled to the inverting input and the non-inverting input, respectively, of the operational amplifier 422. The inverting input of the operational ampli-fier 422 may be configured to receive the SOS control signal 302 through the resistor $R_{INB1}$. The non-inverting input of the operational amplifier 422 may be operably coupled to analog ground GND through resistor $R_{INB2}$. Resistors $R_{INB1}$ and $R_{INB2}$ may be selected to have the same resistance value $R_{INB}$.

The inverting input of the operational amplifier 422 may also be operably coupled to an output of the operational amplifier 422 through resistor $R_{FB1}$. The non-inverting input of the operational amplifier 412 may be operably coupled to the output of the operational amplifier 422 through resistors $R_{FB2}$ and $R_{SB}$. The resistance of $R_{FB1}$ and $R_{FB2}$ may be selected to have the same resistance value $R_{FB}$. An output of the pull current source 420 may be located between resistors $R_{FB2}$ and $R_{SB}$. Accordingly, a pull portion $I_{PULL}$ of the SOS signal 404 may be pulled from by a node between resistors $R_{FB2}$ and $R_{SB}$. Thus configured, the pull portion $I_{PULL}$ of the SOS signal 404 pulled by the pull current source 420 may be expressed as:

$$I_{PULL} = V_{SOSCONTROL} \frac{R_{FB}}{R_{INB} R_{SB}},$$

where $I_{PULL}$ is the current pulled by the pull current source 420, and $V_{SOSCONTROL}$ is the voltage potential of the SOS control signal 302. As is apparent from inspection of this expression, $I_{PULL}$ is proportional to $V_{SOS\ CONTROL}$.

As is apparent from FIG. 4B, the push current source 410 and the pull current source 420 are operably coupled in series (i.e., through the high voltage buffer 500 and the energy storage cell 210). Those of ordinary skill in the art will appreciate that current sources operably coupled in series, such as the push current source 410 and the pull current source 420, must both provide the same amount of current in the same direction. Accordingly, the resistor values $R_{INA}$, $R_{INB}$, $R_{FA}$, $R_{FB}$, $R_{SA}$, and $R_{SB}$ may be selected to make $I_{PUSH}$ equal to $I_{PULL}$.

Those of ordinary skill in the art will also appreciate that it may be difficult to exactly match the components of the push current source 410 to the components of the pull current source 420. In order to compensate for this issue, extra resistors $R_{CA}$ and $R_{CB}$ may be operably coupled in parallel across the push current source 410 and the pull current source 420, respectively. The extra resistors $R_{CA}$ and $R_{CB}$ may be configured to enable extra currents resulting from mismatches between the push current source 410 and the pull current source 420 to dissipate to ground through the extra resistors $R_{CA}$ and $R_{CB}$. Also, as the values of resistors $R_{SA}$ and $R_{SB}$ are not factored into the equations above for $I_{PULL}$ and $I_{PUSH}$, the values of $R_{SA}$ and $R_{SB}$ may be adjusted without creating a mismatch between the push current source 410 and the pull current source 420. Accordingly, in some embodiments, resistors $R_{SA}$ and $R_{SB}$ may be provided as potentiometers that may be adjusted empirically until the push current source 410 and the pull current source 420 achieve adequate matching.

Assuming that the push current source 410 and the pull current source 420 are well balanced, the burden of supply-ing SOS current (and consequently, SOS voltage) to the energy storage cell 210 may be shared substantially equally between push current source 410 and the pull current source 420. Accordingly, stresses on the differential current sources 410, 420 may be balanced.

Also, as previously discussed, the SOS current excitation circuitry 400 may be fully high impedance ground isolated.

As a result, the analog ground terminal GND may be isolated from the terminals of the energy storage cell 210, protecting the analog ground terminal GND from the high direct current source voltage potentials of the energy storage cell 210, and from external noise sources that may affect the terminals of the energy storage cell 210.

Figure 5:
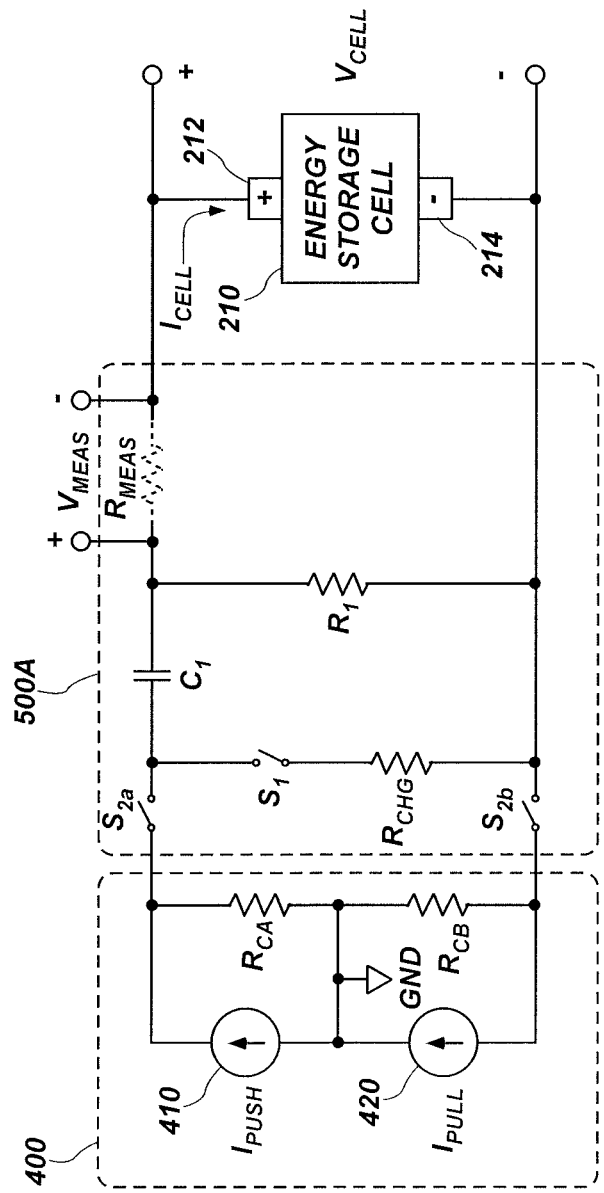
FIG. 5 is a simplified circuit schematic diagram of a high voltage buffer operably coupled to the SOS current excitation circuitry of FIG. 4B, and an energy storage cell of FIG. 2, according to a single coupling capacitor embodiment of the high voltage buffer of FIG. 2.

FIG. 5 is a simplified circuit schematic diagram of a high voltage buffer 500A operably coupled to the SOS current excitation circuitry 400 of FIG. 4B, and the energy storage cell 210 of FIG. 2, according to a single coupling capacitor embodiment of the high voltage buffer 500 of FIG. 2. The high voltage buffer 500A may include a high voltage blocking capacitor $C_1$ configured to operably couple between the push current source 410 of the SOS current excitation circuitry 400 and a positive terminal 212 of the energy storage cell 210. The high voltage blocking capacitor $C_1$ may be configured to prevent direct current from the energy storage cell 210 from circulating through the differential current sources 410, 420. The high voltage blocking capacitor $C_1$ may also be configured to prevent the full direct current supply voltage potential provided by the energy storage cell 210 from being applied to the differential current sources 410, 420 (i.e., because the differential current sources 410, 420 are only direct current coupled to one of the terminals 212, 214 of the energy storage cell 210). In some embodiments, the high voltage blocking capacitor $C_1$ may instead be operably coupled between the pull current source 420 and the negative terminal 214 of the energy storage cell 210, with similar effect.

With the differential current sources 410, 420 already being high impedance ground isolated, and additionally direct current isolated from one of the terminals 212, 214 of the energy storage cell 210 by the high voltage buffer 500A, the energy storage cell 210 may have a relatively large direct current source voltage potential without applying excessive stress to the differential current sources 410, 420. Accordingly, the differential current sources 410, 420 and the high voltage buffer 500A may be used to measure impedance of energy storage cells 210 having larger direct current source voltage potentials than energy storage cells 210 that conventional impedance measuring systems are capable of measuring. By way of non-limiting example, impedance of energy storage cells 210 having direct current voltage source voltages of greater than about sixty (60) volts may be measured. Also by way of non-limiting example, impedance of energy storage cells 210 having direct current voltage source voltages of at least about three hundred (300) volts may be measured.

The high voltage buffer 500A may also include a resistor $R_1$ operably coupled across the positive terminal 212 and a negative terminal 214 of the energy storage cell 210. The resistor $R_1$ may be configured to provide a discharge path for charge stored on the high voltage blocking capacitor $C_1$.

The high voltage buffer 500A may further include pre-charge control circuitry $S_{2a}$, $S_{2b}$, $S_1$, $R_{CHG}$ configured to pre-charge the high voltage blocking capacitor $C_1$. The pre-charge control circuitry $S_{2a}$, $S_{2b}$, $S_1$, $R_{CHG}$ may include a switch $S_{2a}$ operably coupled to the push current source 410, a switch $S_{2b}$ operably coupled to the pull current source 420, and a control switch $S_1$ operably coupled in series with a pre-charge resistor $R_{CHG}$ configured to selectively operably couple a node between the high voltage blocking capacitor $C_1$ and the switch $S_{2a}$ to the negative terminal 214 of the energy storage cell 210 through the pre-charge resistor $R_{CHG}$.

In a pre-charge operation of the high voltage blocking capacitor $C_1$, the control switch $S_1$ may be closed, and switches $S_{2a}$ and $S_{2b}$ may be opened. As a result, the high voltage blocking capacitor $C_1$ may be charged with a blocking voltage. When the pre-charge operation is complete, the control switch S1 may be opened, and switches $S_{2a}$ and $S_{2b}$ may be closed, enabling an SOS signal 404 to be applied to the energy storage cell 210, and measurements to be performed. At the completion of the measurements, a discharge operation of the high voltage blocking capacitor $C_1$ may be performed, and switches $S_{2a}$ and $S_{2b}$ may be opened. Additional switches (not shown) may disconnect the energy storage cell 210 from the high voltage blocking capacitor $C_1$, which may be discharged.

In some embodiments (e.g., in embodiments where it is desired to measure both a voltage response $V_{CELL}$ and a current response $I_{CELL}$ of the energy storage cell 210), the high voltage buffer 500A may also include a current measuring resistor $R_{MEAS}$ operably coupled to one of the positive terminal 212 and the negative terminal 214 of the energy storage cell 210. In the embodiment illustrated in FIG. 5, the measuring resistor $R_{MEAS}$ is operably coupled to the positive terminal 212 of the energy storage cell 210. The current measuring resistor $R_{MEAS}$ may have a known resistance value to enable the current $I_{CELL}$ through the terminals 212, 214 of the energy storage cell 210 to be measured. For example, a voltage potential $V_{MEAS}$ across the current measuring resistor $R_{MEAS}$ may be measured, and the current $I_{CELL}$ may be computed by dividing the voltage potential $V_{MEAS}$ by the known resistance value of current measuring resistor $R_{MEAS}$. In some embodiments, the resistance value of the current measuring resistor $R_{MEAS}$ may be selected to be relatively small in comparison to other system resistances (e.g., resistive components of the energy storage cell 210, source resistances of the differential current sources 410, 420, parasitic resistances of the high voltage blocking capacitor $C_1$, etc.) to reduce the effects of the current measuring resistor $R_{MEAS}$ on electrical signals 216 at the terminals 212, 214 of the energy storage cell 210. By way of non-limiting example, the resistance value of the current measuring resistor $R_{MEAS}$ may be about fifty (50) milliohms (mΩ).

Figure 6:
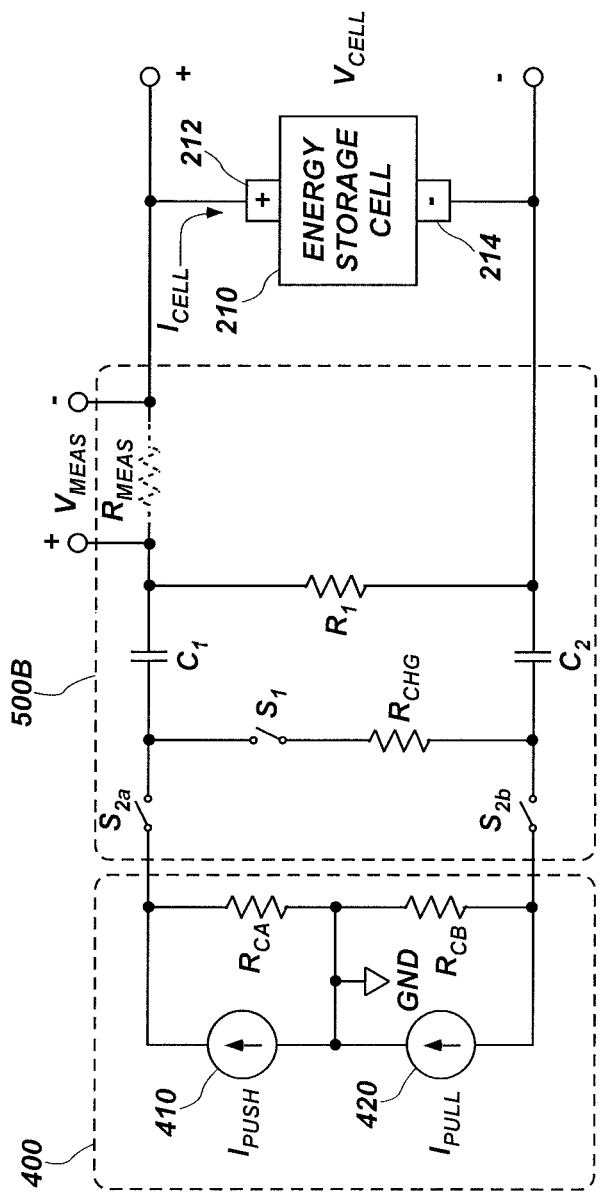
FIG. 6 is a simplified circuit schematic diagram of a high voltage buffer operably coupled to the SOS current excitation circuitry of FIG. 4B, and an energy storage cell of FIG. 2, according to a double coupling capacitor embodiment of the high voltage buffer of FIG. 2.

FIG. 6 is a simplified circuit schematic diagram of a high voltage buffer 500B operably coupled to the SOS current excitation circuitry 400 of FIG. 4B, and the energy storage cell 210 of FIG. 2, according to a double coupling capacitor embodiment of the high voltage buffer 500 of FIG. 2. The high voltage buffer 500B may be similar to the high voltage buffer 500A of FIG. 5, except that the high voltage buffer 500B includes an additional high voltage blocking capacitor $C_2$ operably coupled between the pull current source 420 of the SOS current excitation circuitry 400 and the negative terminal 214 of the energy storage cell 210.

Advantages of the high voltage buffer 500B over the high voltage buffer 500A of FIG. 5 include full direct current decoupling of the differential current sources 410, 420 from the energy storage cell 210 (i.e., because capacitors $C_1$ and $C_2$ decouple the SOS current excitation circuitry 400 from direct current voltage potentials of both of the terminals 212, 214 of the energy storage cell 210). The high voltage blocking capacitors $C_1$ and $C_2$ of the high voltage buffer 500B, however, are effectively operably coupled with each other in series. As a result, a total capacitance would be half of a capacitance value of the high voltage blocking capacitors $C_1$ and $C_2$, assuming that the capacitance values of the high voltage blocking capacitors $C_1$ and $C_2$ are about the same. As a result, the differential current sources 410, 420 operably coupled to the high voltage buffer 500B may be required to support voltage potentials that are about twice as high as the voltage potentials that the differential current sources 410, 420 operably coupled to the high voltage buffer 500A of FIG. 5 may be required to support. These design considerations should be weighed in choosing between using the high voltage buffer 500B of FIG. 6 and the high voltage buffer 500A of FIG. 5.

Figure 7:
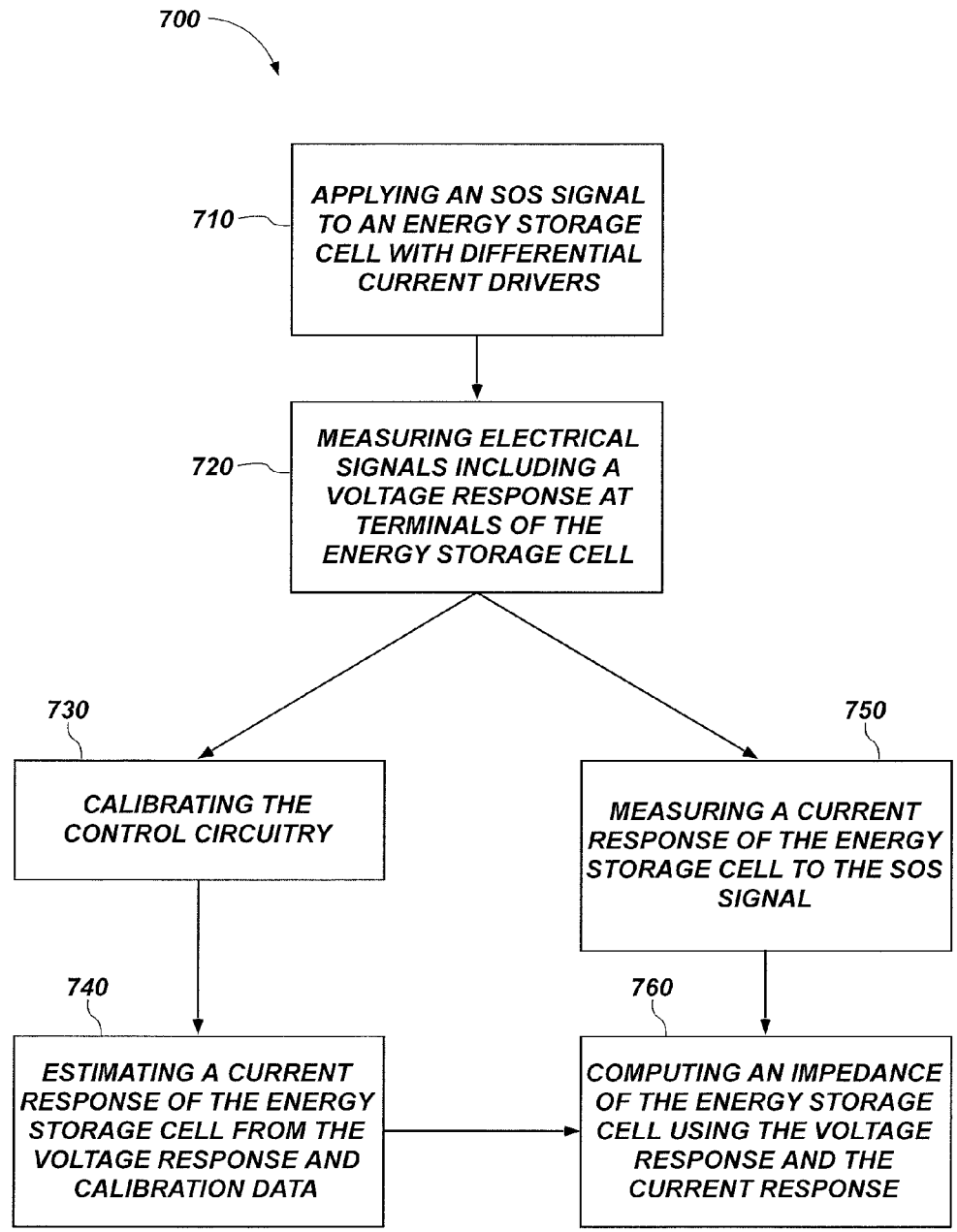
FIG. 7 is a simplified flowchart illustrating a method of measuring impedance of an energy storage cell.

FIG. 7 is a simplified flowchart 700 illustrating a method of measuring impedance of an energy storage cell 210 (FIG. 2). Referring to FIGS. 2 and 7 together, at operation 710, the method may include applying an SOS signal 404 to an energy storage cell 210 with SOS current excitation circuitry 400 including differential current drivers 410, 420 (FIGS. 4A and 4B). In some embodiments, applying the SOS signal 404 may include applying a HOST SOS signal. In some embodiments, applying the SOS signal 404 to the energy storage cell 210 may include applying the SOS signal 404 to the energy storage cell 210 through a high voltage buffer 500, 500A, 500B. In some embodiments, applying the SOS signal 404 may include generating a digital SOS signal 312 (FIG. 3A) with an SOS control module 310 (FIG. 3A), converting the digital SOS signal 312 to a choppy SOS signal 324 (FIG. 3A) with a digital-to-analog converter 320 (FIG. 3A), smoothing the choppy SOS signal 324 with a smoothing filter 330 (FIG. 3A) to generate an SOS control signal 302, and applying the SOS control signal 302 to the SOS current excitation circuitry 400.

At operation 720, the method may include measuring electrical signals 216 including a voltage response $V_{CELL}$ at terminals 212, 214 (FIGS. 5, 6) of the energy storage cell 210. In some embodiments, measuring the electrical signals 216 may include measuring the electrical signals 216 with a signal measuring module 340 (FIG. 3A) of the control circuitry 300, and outputting measured signal data 342 to an impedance computation module 350 (FIG. 3A) of the control circuitry 300.

In some embodiments, at operation 730, the method may include calibrating control circuitry 300 for measuring the electrical signals 216 (e.g., using a single-shunt method of calibrating control circuitry 300 discussed below with reference to FIG. 8, using multiple-shunt calibration, as discussed in Morrison, W. H., Morrison, J. L., Christophersen, J. P., Bald, P. A., *An Advanced Calibration Procedure for Complex Impedance Spectrum Measurements of Advanced Energy Storage*. San Diego: The International Society of Automation, 2012, 58$^{th}$ International Instrumentation Symposium, the entire disclosure of which is incorporated herein in its entirety by this reference). In such embodiments, at operation 740, the method may include estimating a current response $I_{CELL}$ of the energy storage cell 210 from the voltage response $V_{CELL}$ and calibration data resulting from the calibration performed at operation 730.

In some embodiments, no calibration of the control circuitry 300 may be needed. In such embodiments, at operation 750, the method may include measuring a current response $I_{CELL}$ of the energy storage cell 210 to the SOS signal 404 (e.g., by measuring a voltage potential $V_{MEAS}$ across a known resistor $R_{MEAS}$ in series with the terminals 212, 214 of the energy storage cell 210, as shown in FIGS. 5 and 6, and dividing the voltage potential $V_{MEAS}$ by the known value of resistor $R_{MEAS}$).

As previously discussed with reference to operations 730 and 740, the current response $I_{CELL}$ may either be estimated using the voltage response $V_{CELL}$ and the calibration data, or, as discussed with reference to operation 750, the current response $I_{CELL}$ may be measured. Whether estimated or measured, the current response $I_{CELL}$ may be substantially the same. If $I_{CELL}$ is estimated, a calibration may be required, but only a single measurement may be required (to measure $V_{CELL}$). On the other hand, if $I_{CELL}$ is measured, no calibration may be required, but an extra measurement may be required (to measure $V_{MEAS}$). Consideration for these advantages and disadvantages should be taken in determining whether to perform the method through operations 730 and 740, or through operation 750.

At operation 760, the method may include computing an impedance of the energy storage cell 210 using the voltage response $V_{CELL}$ and the current response $I_{CELL}$. By way of non-limiting example, the impedance of the energy storage cell 210 may be computed by dividing a frequency component of the voltage response $V_{CELL}$ corresponding to each of the plurality of different frequencies of the SOS signal 404 by a corresponding frequency component of the current response $I_{CELL}$. In some embodiments, computing the impedance of the energy storage cell 210 includes computing the impedance of the energy storage cell 210 using an impedance computation module 350 (FIG. 3A) of the control circuitry 300.

Figure 8:
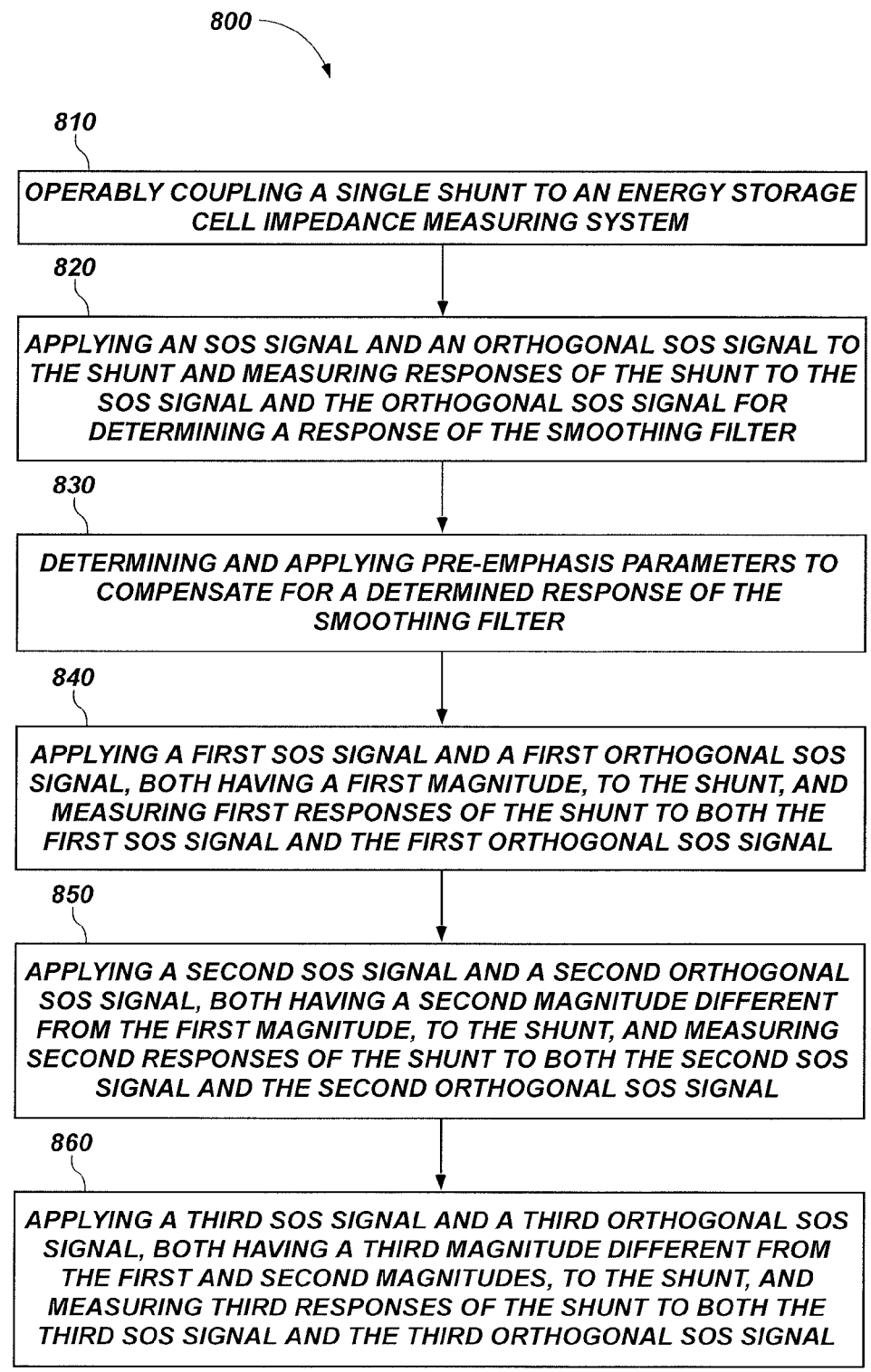
FIG. 8 is a simplified flowchart illustrating an example method of calibrating the control circuitry of the energy storage cell impedance measuring system of FIG. 2.

FIG. 8 is a simplified flowchart 800 illustrating an example method of calibrating the control circuitry 300 of the energy storage cell impedance measuring system 200 of FIG. 2. Referring to FIGS. 2 and 8 together, at operation 810 the method may include operably coupling a single shunt to an energy cell impedance measuring system 200. The single shunt may be operably coupled to the push current source 410 and the pull current source 420 in the same way that the energy storage cell 210 is operably coupled to the push current source 410 and the pull current source 420 (e.g., through the high voltage buffer 500), as discussed above (FIGS. 5 and 6). The single shunt may include a single resistive shunt of known resistance.

At operation 820, the method may include applying an SOS signal 404 and an orthogonal SOS signal (not shown) to the shunt, and measuring responses of the shunt to the SOS signal 404 and the orthogonal SOS signal for determining a response of a smoothing filter 330 (FIG. 3A). As used herein, the term "orthogonal SOS signal" refers to a version of the SOS signal 404 that may be expressed by changing any sine signals of the SOS signal 404 to cosine signals, and any cosine signals of the SOS signal 404 to sine signals. For example, if an SOS signal 404 may be described by $I_{SOS\ SIGNAL} = \sin(\omega t) + \cos(2\omega t) + \sin(3\omega t)$, the corresponding orthogonal SOS signal may be expressed as $I_{ORTHOGONAL\ SOS} = \cos(\omega t) + \sin(2\omega t) + \cos(3\omega t)$. The SOS signal 404 and the orthogonal SOS signal may both include each of the frequencies of interest for measuring impedance of an energy storage cell 210.

In some embodiments, the SOS signal 404 may include a HOST SOS signal, and the orthogonal SOS signal may be a corresponding orthogonal HOST SOS signal. In some embodiments, the SOS signal 404 may include a sum of sines, and the orthogonal SOS signal may include a sum of cosines. In some embodiments, the SOS signal 404 may include a sum of cosines, and the orthogonal SOS signal may include a sum of sines. Other SOS signals 404 and orthogonal SOS signals may also be applied to the shunt within the scope of the present disclosure.

At operation 830, the method may include determining and applying pre-emphasis parameters (e.g., to the SOS control module 310 of FIG. 3A) to compensate for a determined response of the smoothing filter 330. For example, the control circuitry 300 (FIG. 3A) may be configured to determine, for each frequency component of the SOS signal 404 and the orthogonal SOS signal, magnitude and phase responses. The SOS control module 310 may be configured to compensate for each of these magnitude and phase responses in applying SOS signals 404 and orthogonal SOS signals in operations 840, 850, and 860 that follow.

At operation 840, the method may include applying a first SOS signal and a first orthogonal SOS signal, both having a first magnitude, to the shunt, and measuring first responses of the shunt to both the first SOS signal and the first orthogonal SOS signal.

At operation 850, the method may include applying a second SOS signal and a second orthogonal SOS signal, both having a second magnitude different from the first magnitude, to the shunt, and measuring second responses of the shunt to both the second SOS signal and the second orthogonal SOS signal. By way of non-limiting example, the second magnitude may be half of the first magnitude.

At operation 860, the method may include applying a third SOS signal and a third orthogonal SOS signal, both having a third magnitude different from the first and second magnitudes, to the shunt, and measuring third responses of the shunt to both the SOS signal and the orthogonal SOS signal. In some embodiments, the third magnitude may be twice the first magnitude.

Some conventional calibration techniques utilize multiple different shunts having different resistive and reactive values covering a range of expected impedance values of a test energy storage cell. In contrast, the method illustrated in FIG. 8 simulates multiple shunts by adjusting SOS currents applied to the single shunt. In the example illustrated in FIG. 8, six shunts (three different resistive shunts and three different reactive shunts) are simulated. Specifically, applying the first SOS signal (operation 840) corresponds to a first simulated resistance, applying the second SOS signal (operation 850) corresponds to a second simulated resistance of half the resistance of the first simulated resistance, and applying the third SOS signal (operation 860) corresponds to a third simulated resistance of twice the resistance of the first simulated resistance. Accordingly, by adjusting the magnitude of the first SOS signal, a simulated resistance value of the shunt may be altered in proportion.

Similarly, the first orthogonal SOS signal, the second orthogonal SOS signal, and the third orthogonal SOS signal may correspond to three different simulated reactance values. Relatively low levels of capacitive reactance at relatively low frequencies may be simulated with resistive shunts by providing orthogonal SOS signals, and the simulated reactance values may be altered by altering the magnitude of the applied orthogonal SOS signals.

The example of FIG. 8 should be understood to be an example, and not limiting. Within the scope of the disclosure, an infinite number of different permutations of SOS signals and orthogonal SOS signals (e.g., not limited to a first, a second, and a third SOS signal and orthogonal SOS signal) simulating an infinite number of permutations of simulated impedance values expected for a given energy storage cell may be used.

Figure 9:
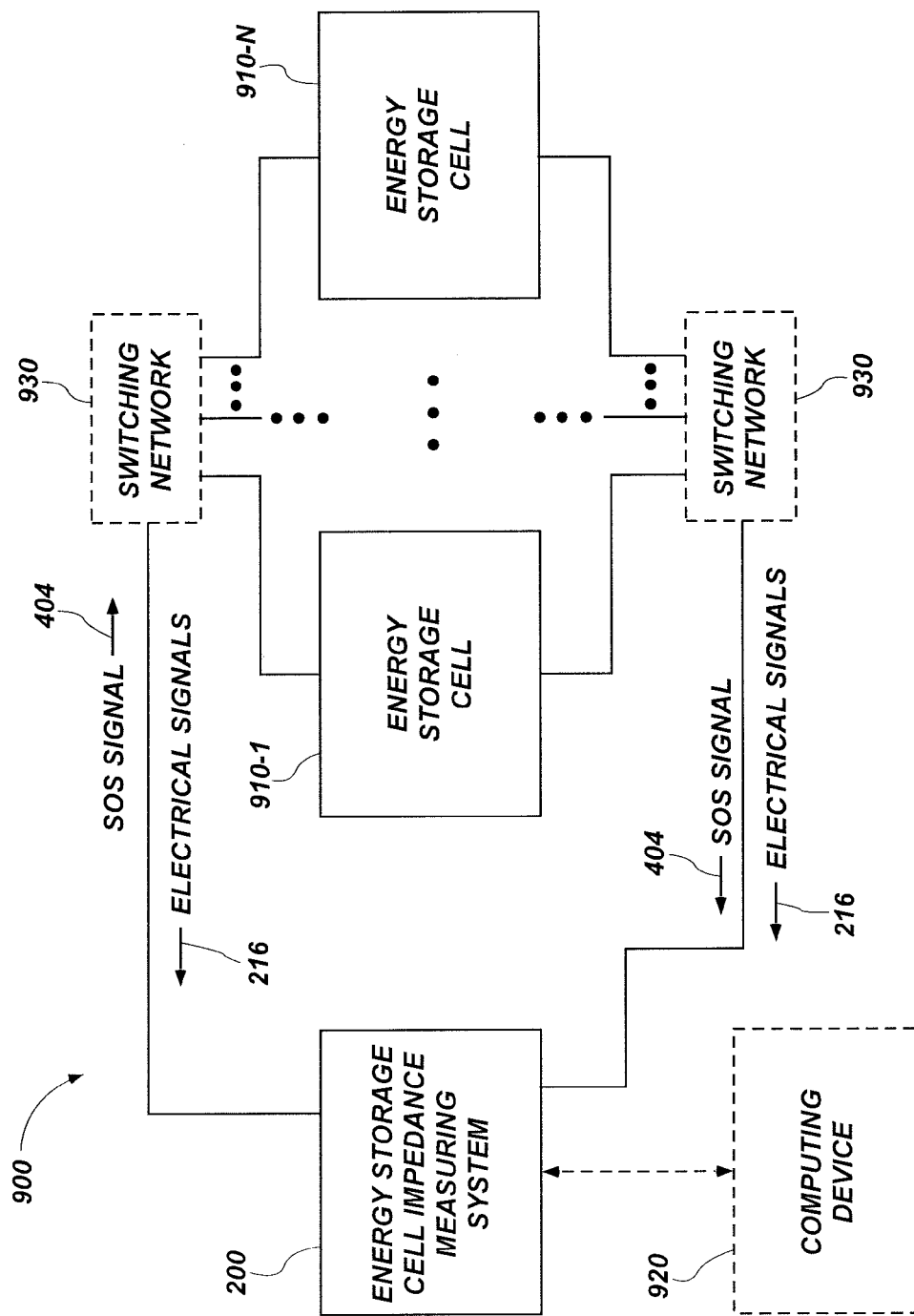
FIG. 9 is a simplified block diagram of an impedance measuring system.

FIG. 9 is a simplified block diagram of an impedance measuring system 900. The impedance measuring system 900 may include an energy storage cell impedance measuring system 200 operably coupled to one or more energy storage cells 910-1, . . . 910-N (sometimes referred to hereinafter generally individually as "energy storage cell" 910, and together as "energy storage cells" 910). The energy storage cell impedance measuring system 200 may be similar to that discussed above with reference to FIG. 2. For example, the energy storage cell impedance measuring system 200 may include control circuitry 300, SOS current excitation circuitry 400 including differential current sources 410, 420 (FIGS. 4A and 4B), and a high voltage buffer 500. The energy storage cell impedance measuring system 200 may be configured to provide SOS signals 404 to terminals of the energy storage cells 910, and measure electrical signals 216 (e.g., voltage responses, current responses, etc.) of the terminals. The energy storage cell impedance measuring system 200 may be configured to determine the impedance of the energy storage cells 910 using the electrical signals 216.

In some embodiments, the energy storage cell impedance measuring system 200 may be operably coupled to the energy storage cells 910 through a switching network 930. The switching network 930 may be configured to selectively (manually or automatically) operably couple the energy storage cell impedance measuring system 200 to one of the energy storage cells 910 at a time, if the energy storage cells 910 include multiple energy storage cells. Accordingly, the switching network 930 may be configured to enable the energy storage cell impedance measuring system 200 to measure the impedance of the energy storage cells 910 one at a time. In some embodiments, however, no switching network 930 may be used, and the energy storage cell impedance measuring system 200 may be operably coupled to each of the energy storage cells 910 (e.g., separately). In some embodiments, the energy storage cell impedance measuring system 200 may include multiple energy storage cell impedance measuring systems 200, each operably coupled to one of the energy storage cells 910. In some embodiments, a single energy storage cell impedance measuring systems 200 may be operably coupled to each of the energy storage cells 910, and configured to selectively apply SOS signals 404 to and measure the resulting electrical signals 216 from each of the energy storage cells 910 at different times.

In some embodiments, the energy storage cell impedance measuring system 200 may include a computing device 920 operably coupled to the energy storage cell impedance measuring system 200. The computing device 920 may include an external computing device (e.g., a personal computer, a laptop computer, an automobile central processing unit, a tablet computer, a smart phone, etc.). In some embodiments, the computing device 920 may be configured to perform at least some of the functions of the control circuitry 300 (FIG. 3A). For example, the computing device 920 may be configured to receive measured signal data 342 (FIG. 3A), and calculate the impedance of the energy storage cells 910 using the measured signal data 342. In some embodiments, the computing device 920 may be configured to further process impedance data 358 (FIG. 3A) provided by the control circuitry 300. By way of non-limiting example, the computing device 920 may be modified with software to enable a user to interactively view plots, generate reports, and other operations associated with the impedance data 358 (FIG. 3A) provided by the control circuitry 300 of the energy storage cell impedance measuring system 200.

In some embodiments, multiple energy storage cells 910 may be desirable. By way of non-limiting example, some electric or hybrid automobiles may benefit from multiple energy storage cell 910 systems.

In some embodiments, an apparatus powered by the one or more energy storage cells 910 may include the energy storage cell impedance measuring system 200, to enable monitoring of the health of the energy storage cells 910 in situ. By way of non-limiting example, an automobile may include the energy storage cell impedance measuring system 200, and the energy storage cells 910. A warning (e.g., visual, audible, or a combination thereof) may be provided when the energy storage cell impedance measuring system 200 detects that one of the energy storage cells 910 should be replaced.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed by the disclosure.

What is claimed is:

1. An energy storage cell impedance measuring device, comprising:
   a sum-of-sinusoids (SOS) current excitation circuit including differential current sources configured to isolate a ground terminal of the differential current sources from a positive terminal and a negative terminal of an energy storage cell, the SOS current excitation circuit configured to apply an SOS signal through the energy storage cell, the SOS signal including a sum of a plurality of sinusoidal current signals, each of the plurality of sinusoidal current signals oscillating at a different one of a plurality of different frequencies; and
   control circuitry configured to operably couple to the SOS current excitation circuit, the positive terminal, and the negative terminal, the control circuitry comprising:
      an SOS control module configured to cause the SOS current excitation circuit to produce the SOS signal;
      at least one signal measuring module configured to measure electrical signals on the positive terminal and the negative terminal of the energy storage cell; and
      an impedance computation module configured to use the electrical signals measured by the at least one signal measuring module to compute an impedance of the energy storage cell for each frequency of the SOS signal.

2. The energy storage cell impedance measuring device of claim 1, wherein the plurality of different frequencies include integer harmonic frequencies of a lowest frequency of the plurality of different frequencies.

3. The energy storage cell impedance measuring device of claim 2, wherein the plurality of sinusoidal current signals of the SOS signals include alternating sine and cosine current signals for each successive frequency of the plurality of different frequencies.

4. The energy storage cell impedance measuring device of claim 1, further comprising a high voltage buffer operably coupled between the SOS current excitation circuit and the energy storage cell, the high voltage buffer configured to isolate at least one signal line of the SOS current excitation circuit carrying at least a portion of the SOS signal from a direct current voltage potential difference between the positive terminal and the negative terminal.

5. The energy storage cell impedance measuring device of claim 4, wherein the high voltage buffer includes a high voltage blocking capacitor operably coupled between at least one of the differential current sources and at least one of the positive terminal and the negative terminal of the energy storage cell.

6. The energy storage cell impedance measuring device of claim 1, wherein the differential current sources include a push current source configured to push current into the energy storage cell, and a pull current source configured to pull current from the energy storage cell.

7. The energy storage cell impedance measuring device of claim 6, wherein the push current source is configured to provide at least substantially a same current as the pull current source.

8. The energy storage cell impedance measuring device of claim 1, wherein the differential current sources are configured to provide the SOS signal through an energy storage cell having a direct current voltage potential output of greater than about sixty (60) volts direct current.

9. The energy storage cell impedance measuring device of claim 1, wherein the differential current sources are configured to provide the SOS signal through an energy storage cell having a direct current voltage potential output of at least about three hundred (300) volts direct current.

10. A method of measuring impedance of an energy storage cell, the method comprising:
    applying, with a sum-of-sinusoids (SOS) current excitation circuit of an impedance measuring device including differential current sources configured to isolate a ground terminal of the differential current sources from a positive terminal and a negative terminal of an energy storage cell, an SOS signal to the energy storage cell, the SOS signal comprising a sum of sinusoidal current signals, each of the sinusoidal current signals oscillating at a different one of a plurality of different frequencies;
    measuring an electrical signal at the positive terminal and the negative terminal of the energy storage cell with at least one signal measuring module of the impedance measuring device coupled to the positive terminal and the negative terminal; and
    computing, with an impedance computation module of the impedance measuring device, an impedance of the energy storage cell at each of the plurality of different frequencies using the measured electrical signal.

11. The method of claim 10, wherein measuring an electrical signal at the positive terminal and the negative terminal with the at least one measuring module comprises:
    measuring a voltage potential response to the SOS signal across the positive terminal and the negative terminal of the energy storage cell; and
    measuring a current response to the SOS signal through the energy storage cell.

12. The method of claim 11, wherein computing, with an impedance computation module, the impedance of the energy storage cell at each of the plurality of different frequencies comprises dividing a portion of the measured voltage potential response that corresponds to each of the plurality of different frequencies by a portion of the measured current response that corresponds to a same one of the plurality of different frequencies.

13. The method of claim 12, wherein computing, with an impedance computation module, the impedance of the energy storage cell comprises calculating the impedance of the energy storage cell without calibrating control circuitry configured to compute the impedance of the energy storage cell.

14. The method of claim 10, further comprising calibrating, using a single shunt of known resistance, control circuitry configured to compute the impedance of the energy storage cell.

15. The method of claim 14, wherein calibrating the control circuitry comprises:
  applying, with the SOS current excitation circuit, a first SOS signal having a first magnitude to the single shunt;
  measuring a response of the single shunt to the first SOS signal with the at least one signal measuring module;
  applying, with the SOS current excitation circuit, a first orthogonal SOS signal having the first magnitude to the single shunt; and
  measuring a response of the single shunt to the first orthogonal SOS signal with the at least one signal measuring module.

16. The method of claim 15, wherein calibrating the control circuitry further comprises:
  applying, with the SOS current excitation circuit, a second SOS signal having a second magnitude, different from the first, to the single shunt;
  measuring a response of the single shunt to the second SOS signal with the at least one signal measuring module;
  applying, with the SOS current excitation circuit, a second orthogonal SOS signal having the second magnitude to the single shunt; and
  measuring a response of the single shunt to the second orthogonal SOS signal with the at least one signal measuring module.

17. The method of claim 10, wherein applying the SOS signal comprises applying, with the SOS current excitation circuit, the SOS signal for a single period of a lowest frequency of the plurality of different frequencies.

18. An energy storage cell impedance measuring circuit, comprising:
  differential current sources, including:
    a push current source configured to operably couple to a positive terminal of an energy storage cell;
    a pull current source configured to operably couple to a negative terminal of the energy storage cell; and
    a ground terminal of the differential current sources operably coupled between the push current source and the pull current source; and
  a high voltage buffer operably coupled to at least one of the push current source and the pull current source and configured to isolate the at least one of the push current source and the pull current source from a direct current voltage provided by the energy storage cell;
  wherein the differential current source is configured to apply a sum-of-sinusoids (SOS) signal through the positive terminal and the negative terminal of the energy storage cell.

19. The energy storage cell impedance measuring circuit of claim 18, wherein the push current source and the pull current source each include an operational amplifier current source.

20. The energy storage cell impedance measuring circuit of claim 18, wherein the high voltage buffer includes at least one capacitor operably coupled between at least one of:
  the push current source and the positive terminal; and
  the pull current source and the negative terminal.

21. The energy storage cell impedance measuring circuit of claim 20, wherein the high voltage buffer includes pre-charge control circuitry configured to pre-charge the at least one capacitor.

22. An impedance measuring system, comprising:
  one or more energy storage cells; and
  an energy storage cell impedance measuring system operably coupled to the one or more energy storage cells, the energy storage cell impedance measuring system including:
    sum-of-sinusoids (SOS) current excitation circuitry including differential current sources, the SOS current excitation circuitry configured to apply SOS signals to the one or more energy storage cells, the SOS signals including sums of a plurality of sinusoidal current signals, each of the plurality of sinusoidal current signals including a different one of a plurality of different frequencies; and
    control circuitry operably coupled to the SOS current excitation circuit and the one or more energy storage cells, the control circuitry configured to:
      control the SOS current excitation circuitry;
      measure electrical signals at terminals of the one or more energy storage cells responsive to the SOS signals; and
      compute impedances of the energy storage cells.

23. The impedance measuring system of claim 22, wherein the one or more energy storage cells include a plurality of energy storage cells.

24. The impedance measuring system of claim 23, further comprising a switching network configured to selectively operably couple the energy storage cell impedance measuring system to the plurality of energy storage cells.

25. The impedance measuring system of claim 22, further comprising an automobile including the one or more energy storage cells.

26. The impedance measuring system of claim 25, wherein the automobile further includes the energy storage cell impedance measuring system.

* * * * *

UNITED STATES PATENT AND TRADEMARK OFFICE
CERTIFICATE OF CORRECTION

PATENT NO. : 9,851,414 B2  
APPLICATION NO. : 14/789959  
DATED : December 26, 2017  
INVENTOR(S) : John L Morrison, William H Morrison and Jon P Christophersen It is certified that error appears in the above-identified patent and that said Letters Patent is hereby corrected as shown below:

In the Specification

| | | |
|---|---|---|
| Column 11, | Line 58, | change "and $_{SOSCONTROL}$ is the" to --and $V_{SOSCONTROL}$ is the-- |
| Column 11, | Line 60, | change "proportional to $V_{SOS\ CONTROL}$." to --proportional to $V_{SOSCONTROL}$.-- |
| Column 15, | Line 44, | change "*Energy Storage*. San Diego:" to --*Energy Storage*, San Diego:-- |
| Column 18, | Line 30, | change "systems 200 may" to --system 200 may-- |

Signed and Sealed this  
Twenty-fourth Day of April, 2018

Andrei Iancu  
*Director of the United States Patent and Trademark Office*